(12) United States Patent
Noda et al.

(10) Patent No.: US 12,125,947 B2
(45) Date of Patent: Oct. 22, 2024

(54) LIGHT EMITTING DEVICE AND PROJECTOR

(71) Applicant: Seiko Epson Corporation, Tokyo (JP)

(72) Inventors: Takafumi Noda, Matsumoto (JP); Yoji Kitano, Chino (JP)

(73) Assignee: SEIKO EPSON CORPORATION (JP)

( * ) Notice: Subject to any disclaimer, the term of this patent is extended or adjusted under 35 U.S.C. 154(b) by 493 days.

(21) Appl. No.: 17/644,806

(22) Filed: Dec. 17, 2021

(65) Prior Publication Data

US 2022/0199861 A1    Jun. 23, 2022

(30) Foreign Application Priority Data

Dec. 18, 2020  (JP) .................. 2020-209972

(51) Int. Cl.
*H01L 33/38* (2010.01)
*G03B 21/20* (2006.01)
*H01L 33/46* (2010.01)

(52) U.S. Cl.
CPC .......... *H01L 33/38* (2013.01); *G03B 21/2033* (2013.01); *H01L 33/46* (2013.01)

(58) Field of Classification Search
CPC ..................................................... H01L 33/46
See application file for complete search history.

(56) References Cited

U.S. PATENT DOCUMENTS

2004/0157354 A1*  8/2004  Kuriyama ............. H01L 31/105
                                                                         438/45
2011/0134941 A1    6/2011  Hoshino et al.
(Continued)

FOREIGN PATENT DOCUMENTS

JP    2007-027298 A    2/2007
JP    2011-124301 A    6/2011
(Continued)

OTHER PUBLICATIONS

Logeeswaran, VJ et al., "A Perspective on Nanowire Photodetectors: Current Status, Future Challenges, and Opportunities", IEEE Journal of Selected Topics in Quantum Electronics, vol. 17, No. 4, Jul. / Aug. 2011, pp. 1002-1032.

*Primary Examiner* — Eugene Lee
(74) *Attorney, Agent, or Firm* — Harness, Dickey & Pierce, P.L.C.

(57) ABSTRACT

A light emitting device includes n columnar parts, and an electrode configured to inject an electrical current into the n columnar parts, wherein each of the n columnar parts includes a first semiconductor layer, a second semiconductor layer different in conductivity type from the first semiconductor layer, and a light emitting layer disposed between the first semiconductor layer and the second semiconductor layer, when viewed from a stacking direction of the first semiconductor layer and the light emitting layer, p first columnar parts out of the n columnar parts fail to overlap an outer edge of the electrode, q second columnar parts out of the n columnar parts overlap the outer edge of the electrode, a number of the second columnar parts centers of which overlap the electrode out of the q second columnar parts is larger than a number of the second columnar parts centers of which fail to overlap the electrode, and n=p+q is fulfilled.

9 Claims, 17 Drawing Sheets

(56) References Cited

U.S. PATENT DOCUMENTS

| | | | |
|---|---|---|---|
| 2011/0309382 A1 | 12/2011 | Lowgren | |
| 2014/0141555 A1 | 5/2014 | Lowgren | |
| 2014/0239327 A1* | 8/2014 | Konsek | H01L 33/60 977/762 |
| 2015/0325743 A1* | 11/2015 | Mi | H01L 21/02573 257/13 |
| 2015/0357520 A1 | 12/2015 | Lowgren | |
| 2016/0056336 A1* | 2/2016 | Hwang | H01L 33/24 257/9 |
| 2017/0077354 A1* | 3/2017 | Lee | H01L 33/382 |
| 2020/0373731 A1* | 11/2020 | Noda | H01S 5/18308 |
| 2020/0412099 A1* | 12/2020 | Miyata | H01S 5/04254 |
| 2021/0175282 A1* | 6/2021 | Ikeda | G09F 9/30 |
| 2022/0310880 A1* | 9/2022 | Kobayashi | G03B 21/2033 |
| 2023/0077383 A1* | 3/2023 | Ishizawa | H01S 5/187 257/99 |
| 2023/0352639 A1* | 11/2023 | Yi | H01L 33/60 |

FOREIGN PATENT DOCUMENTS

| | | |
|---|---|---|
| JP | 2013-534050 A | 8/2013 |
| JP | 5836122 B2 | 12/2015 |
| JP | 2019-029522 A | 2/2019 |

* cited by examiner

LIGHT EMITTING DEVICE AND PROJECTOR

The present application is based on, and claims priority from JP Application Serial Number 2020-209972, filed Dec. 18, 2020, the disclosure of which is hereby incorporated by reference herein in its entirety.

BACKGROUND

1. Technical Field

The present disclosure relates to a light emitting device and a projector.

2. Related Art

Semiconductor lasers are promising as high-luminance next-generation light sources. In particular, a semiconductor laser to which nano-columns are applied is expected to be able to realize narrow-radiation angle high-power light emission due to an effect of a photonic crystal derived from the nano-columns.

For example, in JP-A-2007-27298, there is described a semiconductor light emitting element having a plurality of nano-columns each having an n-type GaN layer, a light emitting layer, a p-type GaN layer sequentially stacked on one another. In such a light emitting element, the nano-columns are grown in a two-dimensional array, and then an electrode is formed on the nano-columns.

In such a light emitting element as described above, when densely disposing the nano-columns, in particular, there exists a nano-column which only partially overlaps the electrode in an outer edge of the electrode. When there exists the nano-column which only partially overlaps the electrode in the outer edge of the electrode, the intensity of the light emitted becomes lower in the vicinity of the outer edge of the electrode compared to that in the center of the electrode in some cases.

SUMMARY

A light emitting device according to an aspect of the present disclosure includes n columnar parts, and an electrode configured to inject an electrical current into the n columnar parts, wherein each of the n columnar parts includes a first semiconductor layer, a second semiconductor layer different in conductivity type from the first semiconductor layer, and a light emitting layer disposed between the first semiconductor layer and the second semiconductor layer, when viewed from a stacking direction of the first semiconductor layer and the light emitting layer, p first columnar parts out of the n columnar parts fail to overlap an outer edge of the electrode, q second columnar parts out of the n columnar parts overlap the outer edge of the electrode, a number of the second columnar parts centers of which overlap the electrode out of the q second columnar parts is larger than a number of the second columnar parts centers of which fail to overlap the electrode, and n=p+q is fulfilled.

A projector according to another aspect of the present disclosure includes the light emitting device according to the above aspect.

DESCRIPTION OF EXEMPLARY EMBODIMENTS

Some preferred embodiments of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. First Embodiment

1.1. Light Emitting Device

1.1.1. Overall Configuration

Figure 1:
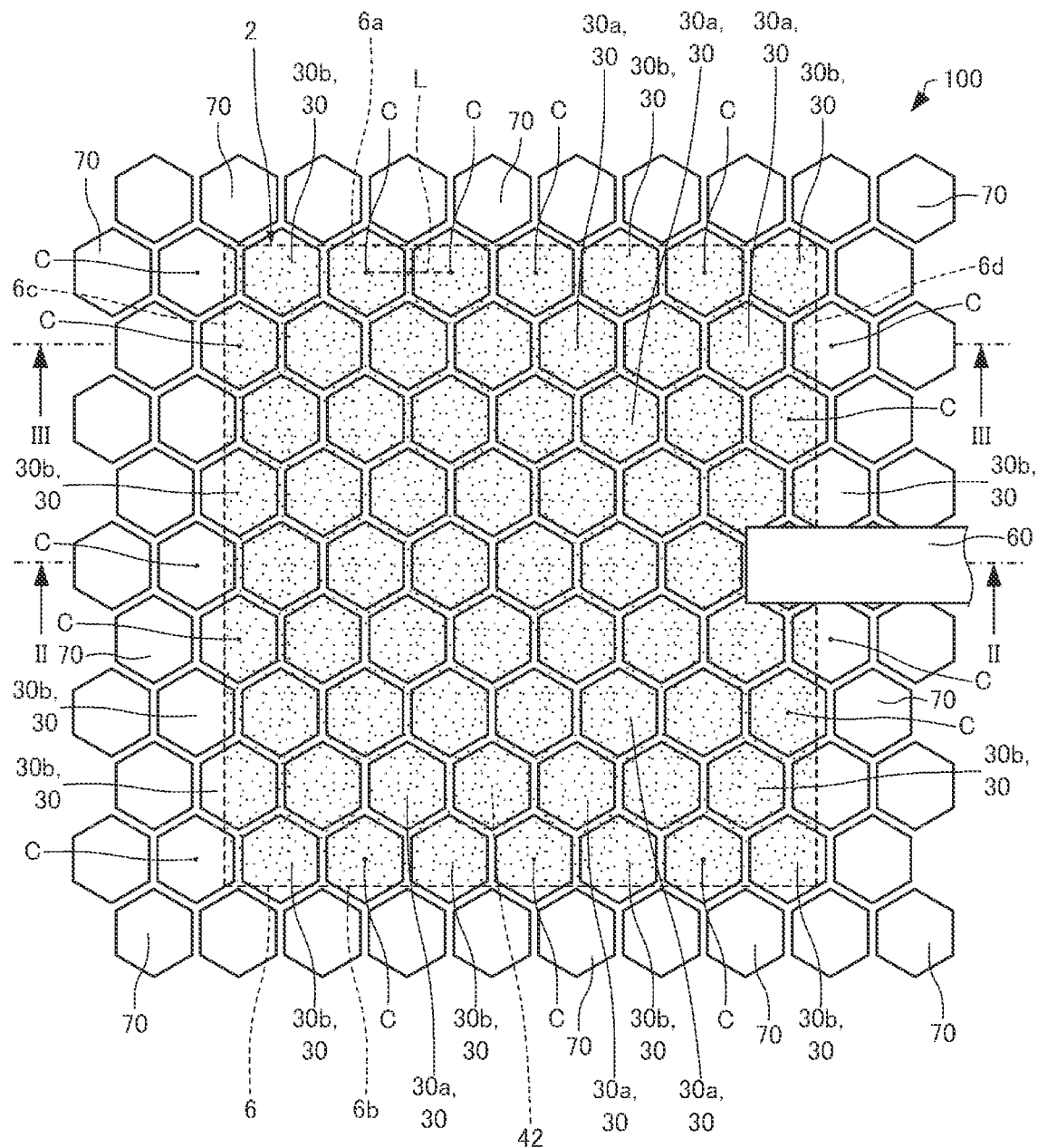
FIG. 1 is a plan view schematically showing a light emitting device according to a first embodiment.
Figure 2:
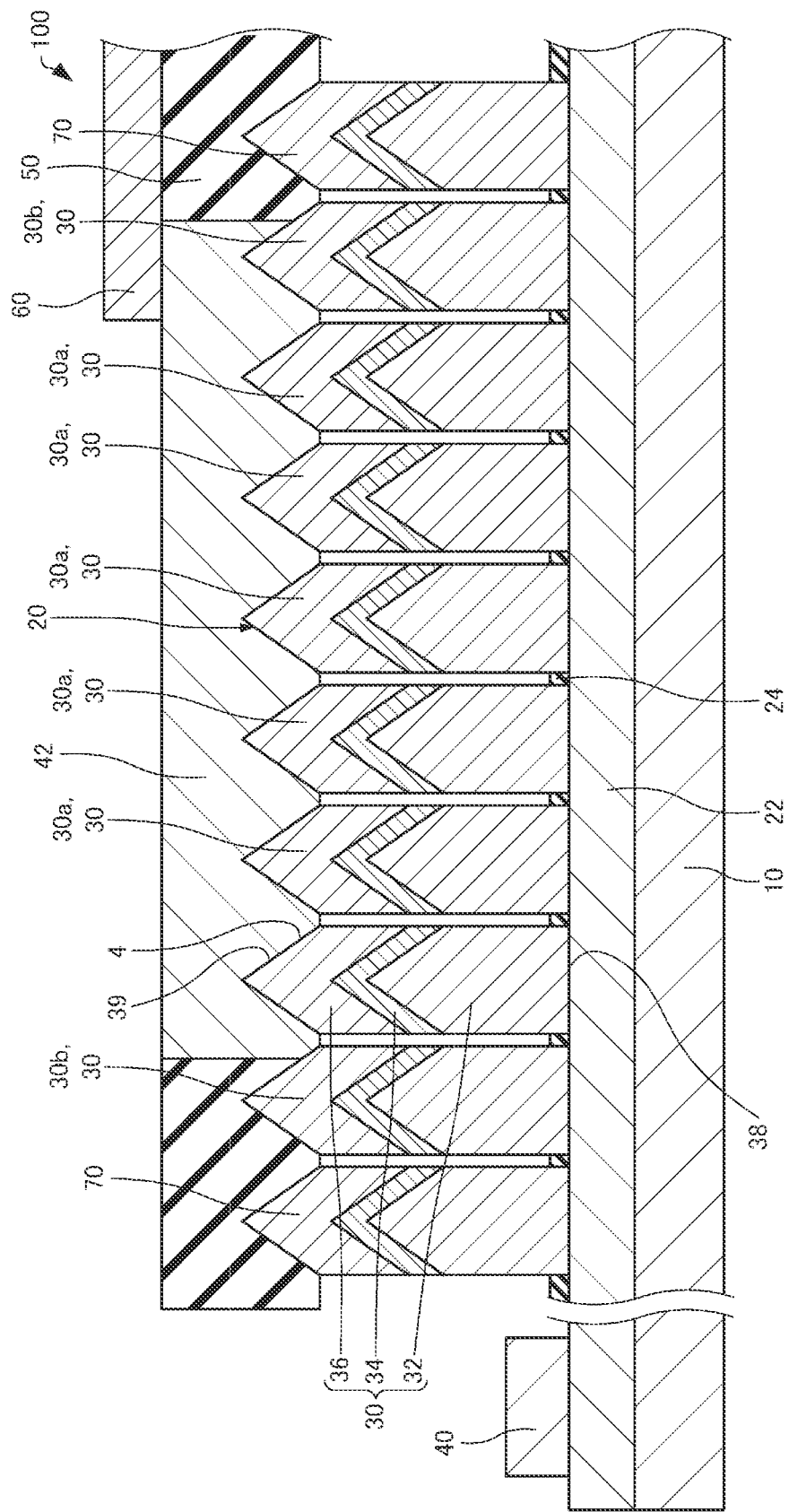
FIG. 2 is a cross-sectional view schematically showing the light emitting device according to the first embodiment.
Figure 3:
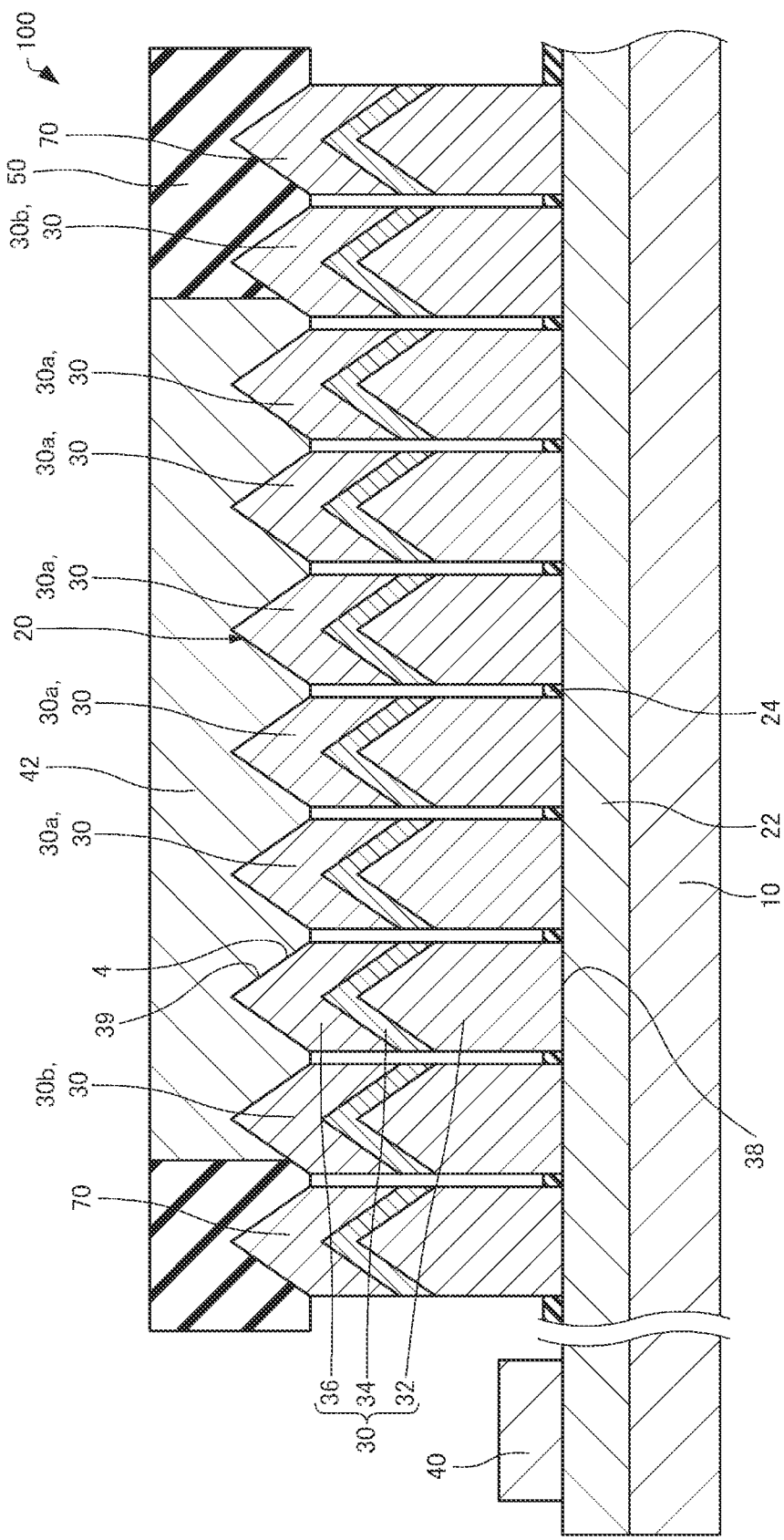
FIG. 3 is a cross-sectional view schematically showing the light emitting device according to the first embodiment.

First, a light emitting device according to a first embodiment will be described with reference to the drawings. FIG. 1 is a plan view schematically showing the light emitting device 100 according to the first embodiment. FIG. 2 is a cross-sectional view along the line II-II shown in FIG. 1, and schematically shows the light emitting device 100 according to the first embodiment. FIG. 3 is a cross-sectional view along the line III-III shown in FIG. 1, and schematically shows the light emitting device 100 according to the first embodiment.

As shown in FIG. 1 through FIG. 3, the light emitting device 100 has, for example, a substrate 10, a stacked body 20, a first electrode 40, a second electrode 42, an insulating layer 50, an interconnection 60, and dummy columnar parts 70. The light emitting device 100 is, for example, a semiconductor laser. It should be noted that in FIG. 1, the illustration of members other than columnar parts 30, the second electrode 42, the interconnection 60, and the dummy columnar parts 70 is omitted for the sake of convenience. Further, in FIG. 1, illustration is presented seeing through the second electrode 42. The dummy columnar parts 70 each correspond to a third columnar part in the appended claims.

The substrate 10 is, for example, an Si substrate, a GaN substrate, a sapphire substrate, or an SiC substrate.

The stacked body 20 is provided to the substrate 10. In the illustrated example, the stacked body 20 is disposed on the substrate 10. The stacked body 20 has, for example, a buffer layer 22 and the columnar parts 30.

In the present specification, when taking a light emitting layer 34 as a reference in a stacking direction of the stacked body 20 (hereinafter also referred to simply as a "stacking direction"), the description will be presented assuming a direction from the light emitting layer 34 toward a second semiconductor layer 36 as an "upward direction," and a direction from the light emitting layer 34 toward a first semiconductor layer 32 as a "downward direction." Further, a direction perpendicular to the stacking direction is also referred to as an "in-plane direction." Further, the "stacking direction of the stacked body 20" means a stacking direction of the first semiconductor layer 32 and the light emitting layer 34 in the columnar part 30.

The buffer layer 22 is disposed on the substrate 10. The buffer layer 22 is, for example, an Si-doped n-type GaN layer. On the buffer layer 22, there is disposed a mask layer 24 for forming the columnar parts 30. The mask layer 24 is, for example, a silicon oxide layer, a titanium layer, a titanium oxide layer, or an aluminum oxide layer.

The columnar parts 30 are disposed on the buffer layer 22. The columnar parts 30 each have a columnar shape protruding upward from the buffer layer 22. In other words, the columnar parts 30 protrude upward from the substrate 10 via the buffer layer 22. The columnar part 30 is also referred to as, for example, a nano-column, a nano-wire, a nano-rod, or a nano-pillar. The planar shape of the columnar part 30 is, for example, a polygonal shape or a circle. In the example shown in FIG. 1, the planar shape of the columnar part 30, namely a shape of an outer edge of the columnar part 30 viewed from the stacking direction, is a regular hexagonal shape. However, the planar shape of the columnar part 30 is not limited thereto. The planar shape of the columnar part 30 can be, for example, a circular shape, an elliptical shape, or a polygonal shape such as a hexagon.

The diametrical size of the columnar part 30 is, for example, no smaller than 50 nm and no larger than 500 nm. By setting the diametrical size of the columnar part 30 to be no larger than 500 nm, it is possible to obtain the light emitting layer 34 made of crystal high in quality, and at the same time, it is possible to reduce a distortion inherent in the light emitting layer 34. Thus, it is possible to amplify light generated in the light emitting layer 34 with high efficiency.

It should be noted that when the planar shape of the columnar part 30 is a circle, the "diametrical size of the columnar part" means the diameter of the circle, and when the planar shape of the columnar part 30 is not a circular shape, the "diametrical size of the columnar part" means the diameter of the minimum bounding circle. For example, when the planar shape of the columnar part 30 is a polygonal shape, the diametrical size of the columnar part is the diameter of a minimum circle including the polygonal shape inside, and when the planar shape of the columnar part 30 is an ellipse, the diametrical size of the columnar part 30 is the diameter of a minimum circle including the ellipse inside.

There is disposed a plurality of the columnar parts 30. Between the columnar parts 30 adjacent to each other, there is, for example, an air gap. An interval between the columnar parts 30 adjacent to each other is, for example, no smaller than 1 nm and no larger than 500 nm. The plurality of columnar parts 30 is arranged at a predetermined pitch in a predetermined direction when viewed from the stacking direction. In the illustrated example, the plurality of columnar parts 30 is arranged so as to form, for example, a triangular lattice. It should be noted that the arrangement of the plurality of columnar parts 30 is not particularly limited, and the plurality of columnar parts 30 can be arranged to form a quadrangular lattice such as a square lattice or a rectangular lattice. The plurality of columnar parts 30 can develop an effect of a photonic crystal.

It should be noted that the "pitch of the columnar parts" means a distance between the centers C of the columnar parts 30 adjacent to each other along the predetermined direction. When the planar shape of the columnar part 30 is a circle, the "center of the columnar part" means the center of the circle, and when the planar shape of the columnar part 30 is not a circular shape, the "center of the columnar part" means the center of the minimum bounding circle. For example, when the planar shape of the columnar part 30 is a polygonal shape, the center of the columnar part 30 is the center of a minimum circle including the polygonal shape inside, and when the planar shape of the columnar part 30 is an ellipse, the center of the columnar part 30 is the center of a minimum circle including the ellipse inside.

As shown in FIG. 2, the columnar parts 30 each have the first semiconductor layer 32, the light emitting layer 34, and the second semiconductor layer 36.

The first semiconductor layer 32 is disposed on the buffer layer 22. The first semiconductor layer 32 is disposed between the substrate 10 and the light emitting layer 34. The first semiconductor layer 32 is, for example, an Si-doped n-type GaN layer.

The light emitting layer 34 is disposed on the first semiconductor layer 32. The light emitting layer 34 is disposed between the first semiconductor layer 32 and the second semiconductor layer 36. The light emitting layer 34 generates light in response to injection of an electrical current. The light emitting layer 34 has, for example, a well layer and a barrier layer. The well layer and the barrier layer are each an i-type semiconductor layer which is not intentionally doped with any impurity. The well layer is, for example, an InGaN layer. The barrier layer is, for example, a GaN layer. The light emitting layer 34 has an MQW (Multiple Quantum Well) structure constituted by the well layers and the barrier layers.

It should be noted that the numbers of the well layers and the barrier layers constituting the light emitting layer 34 are not particularly limited. For example, the number of the well layers disposed can be one, and in that case, the light emitting layer 34 has an SQW (Single Quantum Well) structure.

The second semiconductor layer 36 is disposed on the light emitting layer 34. The second semiconductor layer 36 is a layer different in conductivity type from the first semiconductor layer 32. The second semiconductor layer 36 is, for example, an Mg-doped p-type GaN layer. The first semiconductor layer 32 and the second semiconductor layer 36 are cladding layers having a function of confining the light in the light emitting layer 34.

The columnar parts 30 each have a first surface 38 at the substrate 10 side, and a second surface 39 at an opposite side to the first surface 38. In the illustrated example, the second surface 39 is formed of a facet surface 4. The first surface 38 is, for example, a lower surface of the columnar part 30. The second surface 39 is, for example, an upper surface of the columnar part 30.

It should be noted that although not shown in the drawings, an OCL (Optical Confinement Layer) can be disposed between the first semiconductor layer 32 and the light emitting layer 34. Further, an EBL (Electron Blocking Layer) can be disposed between the light emitting layer 34 and the second semiconductor layer 36.

In the light emitting device 100, a pin diode is constituted by the second semiconductor layer 36 of the p-type, the light emitting layer 34 of the i-type doped with no impurity, and the first semiconductor layer 32 of the n-type. In the light emitting device 100, when a forward bias voltage of the pin diode is applied between the first electrode 40 and the second electrode 42, an electrical current is injected into the light emitting layer 34, and recombination of electrons and holes occurs in the light emitting layer 34. The recombination causes light emission. The light generated in the light emitting layer 34 propagates in an in-plane direction to form a standing wave due to the effect of the photonic crystal caused by the plurality of columnar parts 30, and is then gained by the light emitting layer 34 to cause laser oscillation. Then, the light emitting device 100 emits positive first-order diffracted light and negative first-order diffracted light as a laser beam in the stacking direction.

It should be noted that it is also possible to dispose a reflecting layer between the substrate 10 and the buffer layer 22, or below the substrate 10 although not shown in the drawings. The reflecting layer is, for example, a DBR (Distributed Bragg Reflector) layer. Due to the reflecting layer, it is possible to reflect the light generated in the light emitting layer 34, and thus, it is possible for the light emitting device 100 to emit the light only from the second electrode 42 side.

The first electrode 40 is disposed on the buffer layer 22. It is also possible for the buffer layer 22 to have ohmic contact with the first electrode 40. The first electrode 40 is electrically coupled to the first semiconductor layer 32. In the illustrated example, the first electrode 40 is electrically coupled to the first semiconductor layer 32 via the buffer layer 22. The first electrode 40 is one of electrodes for injecting the electrical current into the light emitting layer 34. As the first electrode 40, there is used, for example, what is obtained by stacking a Cr layer, an Ni layer, and an Au layer in this order from the buffer layer 22 side.

The second electrode 42 is disposed on the second semiconductor layer 36. The second electrode 42 is electrically coupled to the second semiconductor layer 36. It is also possible for the second semiconductor layer 36 to have ohmic contact with the second electrode 42. The second electrode 42 is the other of the electrodes for injecting the electrical current into the light emitting layer 34. As the second electrode 42, there is used, for example, ITO (indium tin oxide).

The insulating layer 50 is disposed on the periphery of the second electrode 42 when viewed from the stacking direction. The insulating layer 50 is disposed on the dummy columnar parts 70. The insulating layer 50 is, for example, a silicon oxide layer. The insulating layer 50 electrically separates the columnar parts 30 and the interconnection 60 from each other.

The interconnection 60 is disposed on the second electrode 42 and the insulating layer 50. The interconnection 60 is, for example, a Cu layer, an Al layer, a layer made of an alloy of Cu and Al, a Ti layer, or a W layer. The interconnection 60 is an interconnection for making the electrical current flow through the second electrode 42.

The dummy columnar parts 70 are disposed on the buffer layer 22. The shape and the size of each of the dummy columnar parts 70 are the same as, for example, the shape and the size of each of the columnar parts 30, respectively. The materials of the dummy columnar part 70 are the same as those of the columnar part 30. The dummy columnar parts 70 do not overlap the second electrode 42 when viewed from the stacking direction. The dummy columnar parts 70 do not have contact with the second electrode 42.

It should be noted that although the light emitting layer 34 of the InGaN type is described above, as the light emitting layer 34, there can be used a variety of types of material system capable of emitting light in response to injection of an electrical current in accordance with the wavelength of the light to be emitted. It is possible to use semiconductor materials of, for example, an AlGaN type, an AlGaAs type, an InGaAs type, an InGaAsP type, an InP type, a GaP type, or an AlGaP type.

Further, the light emitting device 100 is not limited to the laser, and can also be an LED (Light Emitting Diode).

1.1.2. Relationship Between Columnar Part and Second Electrode

The light emitting device 100 has a pixel 2. The pixel 2 has n columnar parts 30, and the second electrode 42 for injecting the electrical current into each of the n columnar parts 30. Further, the pixel 2 has, for example, the buffer layer 22 and the first electrode 40. The reference symbol n denotes an integer equal to or greater than, for example, 20. In the example shown in FIG. 1, there is assumed n=72. When viewed from the stacking direction, the n columnar parts 30 each overlap the second electrode 42. The n columnar parts 30 are arranged so as to form a triangular lattice. The reference symbol n denotes a number of the columnar parts.

When viewed from the stacking direction, p first columnar parts 30a out of the n columnar parts 30 do not overlap an outer edge 6 of the second electrode 42. The reference symbol p denotes an integer greater than zero. In the example shown in FIG. 1, there is assumed p=42. In the example shown in FIG. 2, the first columnar parts 30a have contact with the second electrode 42 in the entire area of the second surface 39. The reference symbol p denotes a number of the first columnar parts.

When viewed from the stacking direction, q second columnar parts 30b out of the n columnar parts 30 overlap the outer edge 6 of the second electrode 42. It should be noted that n=p+q is fulfilled. The reference symbol q denotes an integer greater than zero. In the example shown in FIG. 1, there is assumed q=30. In the example shown in FIG. 2, the second columnar parts 30b have contact with the second electrode 42 in a part of the second surface 39. The reference symbol q denotes a number of the second columnar parts.

When viewed from the stacking direction, the number of the second columnar parts 30b the centers C of which overlap the second electrode 42 out of the q second columnar parts 30b is larger than the number of the second columnar parts 30b the centers C of which do not overlap the second electrode 42. In the example shown in FIG. 1, the number of the second columnar parts 30b the centers C of which overlap the second electrode 42 out of the q second columnar parts 30b is 21. The number of the second columnar parts 30b the centers C of which do not overlap the second electrode 42 out of the q second columnar parts 30b is 9. The position of the center C is, for example, a position of a vertex of the facet surface 4.

When viewed from the stacking direction, the outer edge 6 of the second electrode 42 has, for example, a first side 6a, a second side 6b, a third side 6c, and a fourth side 6d.

The first side 6a is parallel to a first line segment L connecting the centers of the columnar parts 30 adjacent to each other out of the n columnar parts 30. The second side 6b is parallel to the first side 6a. The third side 6c is perpendicular to the first side 6a. The fourth side 6d is parallel to the third side 6c. The planar shape of the second electrode 42 is, for example, a rectangle. The length of the first side 6a is an integral multiple of a pitch of the n columnar parts 30, and seven times of the pitch of the n columnar parts 30 in the illustrated example. It should be noted that the planar shape of the second electrode 42 is not limited to the rectangle.

When viewed from the stacking direction, the center C of each of r second columnar parts 30b overlapping the first side 6a out of the q second columnar parts 30b overlaps the second electrode 42. The reference symbol r denotes an integer greater than zero. In the illustrated example, r=7 is assumed. The center C of each of s second columnar parts 30b overlapping the second side 6b out of the q second columnar parts 30b overlaps the second electrode 42. The reference symbol s denotes an integer greater than zero. In the illustrated example, s=7 is assumed. The reference symbol r denotes a number of the r second columnar parts When viewed from the stacking direction, the center C of each of v second columnar parts 30b overlapping the third side 6c overlaps the second electrode 42. The reference symbol v denotes an integer greater than zero. In the illustrated example, v=4 is assumed. The center C of each of w second columnar parts 30b overlapping the fourth side 6d overlaps the second electrode 42. The reference symbol w denotes an integer greater than zero. In the illustrated example, w=5 is assumed.

The light emitting device 100 has t dummy columnar parts 70. The reference symbol t denotes an integer equal to or greater than, for example, 10. In the example shown in FIG. 1, there is assumed t=38. When viewed from the stacking direction, the dummy columnar parts 70 do not overlap the second electrode 42. The t dummy columnar parts 70 surround the n columnar parts 30.

In the illustrated example, the first columnar part 30a and the dummy columnar part 70 are not adjacent to each other in the direction of the first side 6a. In other words, in the illustrated example, the dummy columnar part 70 adjacent to the first columnar part 30a in the direction of the first side 6a does not exist. Here, the "dummy columnar part 70 adjacent to the first columnar part 30a in the direction of the first side 6a" means the dummy columnar part 70, in which a line segment parallel to the first side 6a connecting the center C of the first columnar part 30a and the center C of the dummy columnar part 70 does not cross the second columnar part 30b. Further, the "direction of the first side 6a" means an extending direction of the first side 6a.

1.1.3. Functions and Advantages

In the light emitting device 100, when viewed from the stacking direction, the p first columnar parts 30a out of the n columnar parts 30 do not overlap the outer edge 6 of the second electrode 42, the q second columnar parts 30b out of the n columnar parts 30 overlap the outer edge 6 of the second electrode 42, the number of the second columnar parts 30b the centers C of which overlap the second electrode 42 is larger than the number of the second columnar parts 30b the centers C of which do not overlap the second electrode 42, and n=p+q is fulfilled. Therefore, in the light emitting device 100, it is possible to reduce the number of the second columnar parts 30b which do not emit light due to non-light-emitting recombination caused by dangling bond compared to when the number of the second columnar parts 30b the centers C of which overlap the second electrode 42 is smaller than the number of the second columnar parts 30b the centers C of which do not overlap the second electrode 42. Thus, it is possible to reduce an amount of reduction of the light emission intensity in the vicinity of the outer edge of the second electrode 42. The dangling bond exists on a side surface of the columnar part, and when injecting the electrical current into only the vicinity of the outer circumference of an upper surface of the columnar part, the electrical current causes the non-light-emitting recombination, and thus, the columnar part fails to emit light in some cases.

In the light emitting device 100, when viewed from the stacking direction, the n columnar parts 30 are arranged in the triangular lattice, the outer edge 6 of the second electrode 42 has the first side 6a parallel to the first line segment L connecting the centers C of the columnar parts 30 adjacent to each other out of the n columnar parts 30, and the center C of each of the r second columnar parts 30b overlapping the first side 6a out of the q second columnar parts 30b overlaps the second electrode 42. Therefore, in the light emitting device 100, it is possible to more surely make the r second columnar parts 30b overlapping the first side 6a emit light.

In the light emitting device 100, when viewed from the stacking direction, the outer edge 6 of the second electrode 42 has the second side 6b parallel to the first side 6a, and the center C of each of the s second columnar parts 30b overlapping the second side 6b out of the q second columnar parts 30b overlaps the second electrode 42. Therefore, in the light emitting device 100, it is possible to more surely make the s second columnar parts 30b overlapping the second side 6b emit light.

In the light emitting device 100, when viewed from the stacking direction, there are provided t dummy columnar parts 70 not overlapping the second electrode 42, and the t dummy columnar parts 70 surround the n columnar parts 30. Therefore, in the light emitting device 100, the damage applied to the n columnar parts 30 when manufacturing the light emitting device 100 can be reduced by the t dummy columnar pars 70. When the damage is applied to the columnar part, a crystal defect is caused, and thus the electrical current is leaked in some cases.

1.2. Method of Manufacturing Light Emitting Device

Figure 4:
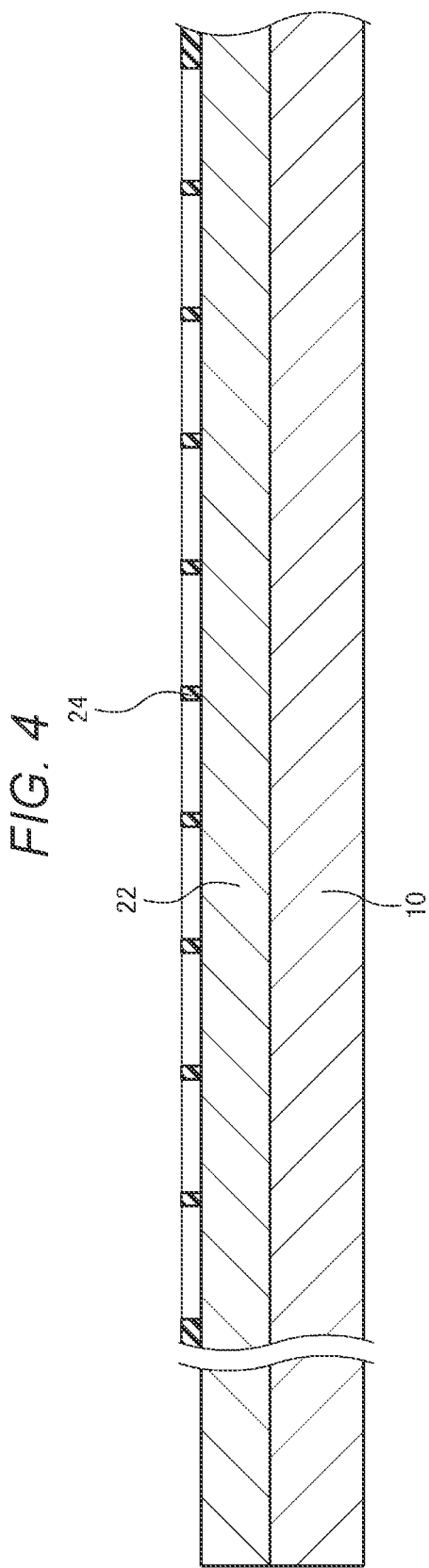
FIG. 4 is a cross-sectional view schematically showing a manufacturing process of the light emitting device according to the first embodiment.

Then, a method of manufacturing the light emitting device 100 according to the first embodiment will be described with reference to the drawings. FIG. 4 is a cross-sectional view schematically showing a manufacturing process of the light emitting device 100 according to the first embodiment.

As shown in FIG. 4, the buffer layer 22 is grown epitaxially on the substrate 10. As the method of achieving the epitaxial growth, there can be cited, for example, an MOCVD (Metal Organic Chemical Vapor Deposition) method and an MBE (Molecular Beam Epitaxy) method.

Then, the mask layer 24 is formed on the buffer layer 22. The mask layer 24 is formed by deposition using, for example, an electron beam evaporation method or a spattering method, and patterning. The patterning process is performed using a photolithography process and an etching process.

As shown in FIG. 1, the first semiconductor layer 32, the light emitting layer 34, and the second semiconductor layer 36 are grown epitaxially in this order on the buffer layer 22 using the mask layer 24 as a mask. As the method of achieving the epitaxial growth, there can be cited, for example, the MOCVD method and the MBE method. Due to the present process, it is possible to form the plurality of columnar parts 30. Further, due to the present process, it is possible to form the plurality of dummy columnar parts 70.

Then, the first electrode 40 is formed on the buffer layer 22, and the second electrode 42 is formed on the second semiconductor layer 36. The first electrode 40 and the second electrode 42 are formed using, for example, a vacuum deposition method. It should be noted that the order of the formation of the first electrode 40 and the formation of the second electrode 42 is not particularly limited.

Due to the process described hereinabove, it is possible to manufacture the light emitting device 100.

1.3. Modified Examples of Light Emitting Device

1.3.1. First Modified Example

Figure 5:
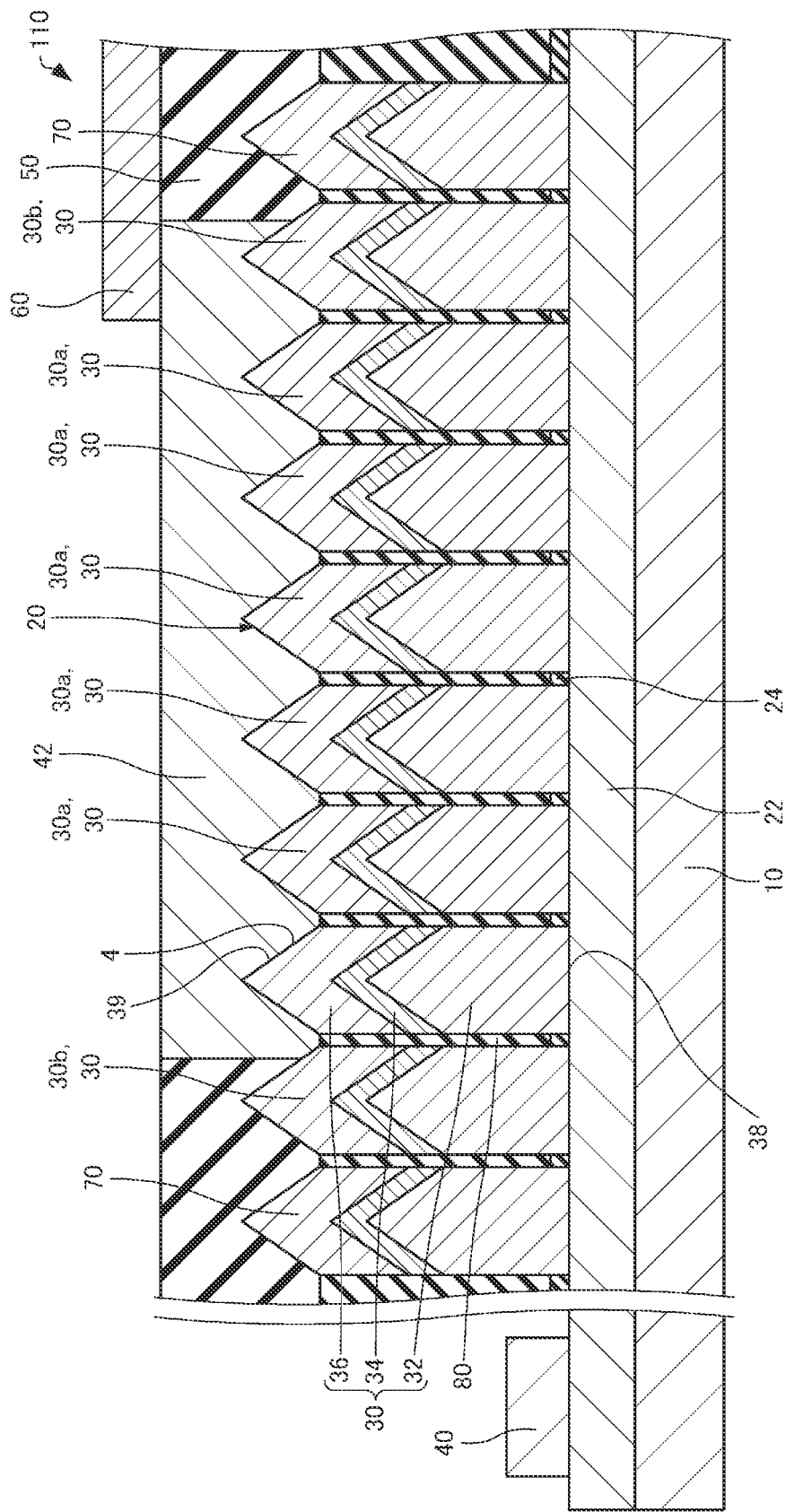
FIG. 5 is a cross-sectional view schematically showing a light emitting device according to a first modified example of the first embodiment.
Figure 6:
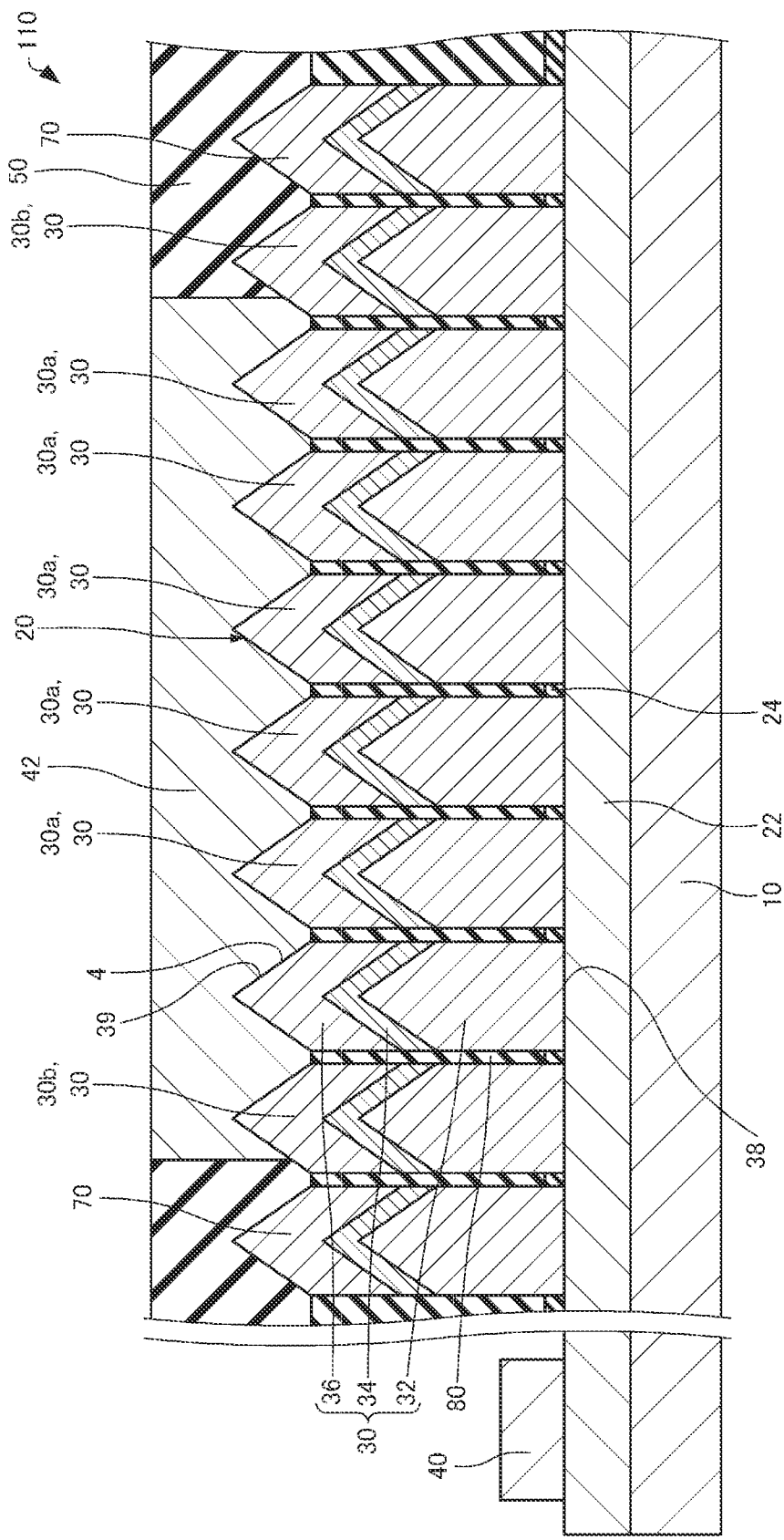
FIG. 6 is a cross-sectional view schematically showing the light emitting device according to the first modified example of the first embodiment.

Then, a light emitting device according to a first modified example of the first embodiment will be described with reference to the drawings. FIG. 5 and FIG. 6 are each a cross-sectional view schematically showing the light emitting device 110 according to the first modified example of the first embodiment. It should be noted that FIG. 5 corresponds to a cross-sectional view along the line II-II of the light emitting device 100 described above, and FIG. 6 corresponds to a cross-sectional view along the line III-III of the light emitting device 100 described above.

Hereinafter, in the light emitting device 110 according to the first modified example of the first embodiment, the members having substantially the same functions as those of the constituent members of the light emitting device 100 according to the first embodiment described above will be denoted by the same reference symbols, and detailed descriptions thereof will be omitted. The same applies to a light emitting device according to a second modified example described below of the first embodiment.

As shown in FIG. 2 and FIG. 3, in the light emitting device 100 described above, the air gap is provided between the columnar parts 30 adjacent to each other.

In contrast, in the light emitting device 110, a light propagation layer 80 is provided between the columnar parts 30 adjacent to each other as shown in FIG. 5 and FIG. 6. In the illustrated example, the light propagation layers 80 are disposed on the mask layer 24. The light propagation layers 80 are each, for example, a silicon oxide layer. In the light emitting device 110, the light generated in the light emitting layer 34 passes through the light propagation layer 80 in the in-plane direction to thereby propagate. The light propagation layer 80 is formed using, for example, a CVD (Chemical Vapor Deposition) method or a spin coat method.

1.3.2. Second Modified Example

Figure 7:
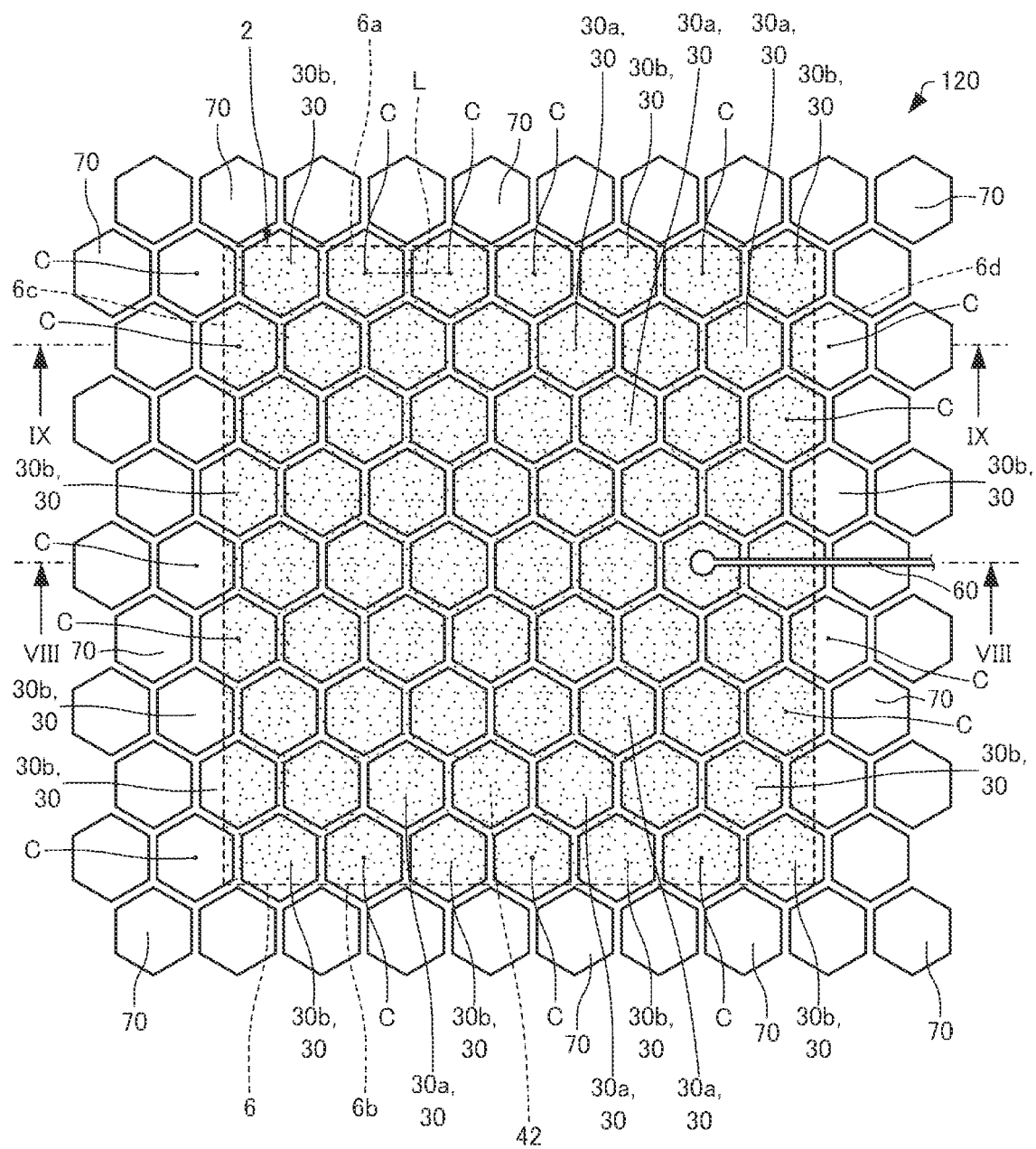
FIG. 7 is a plan view schematically showing a light emitting device according to a second modified example of the first embodiment.
Figure 8:
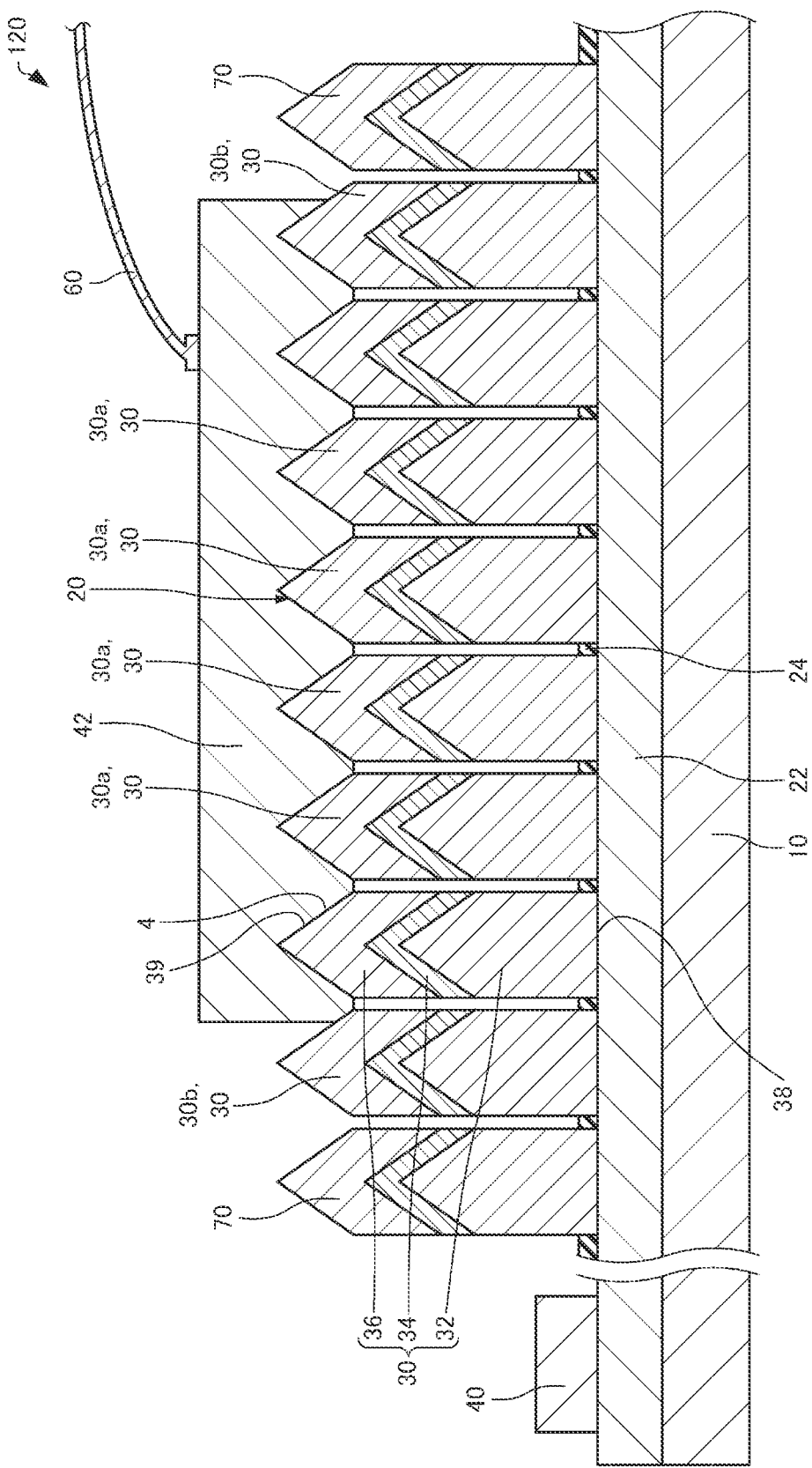
FIG. 8 is a cross-sectional view schematically showing the light emitting device according to the second modified example of the first embodiment.
Figure 9:
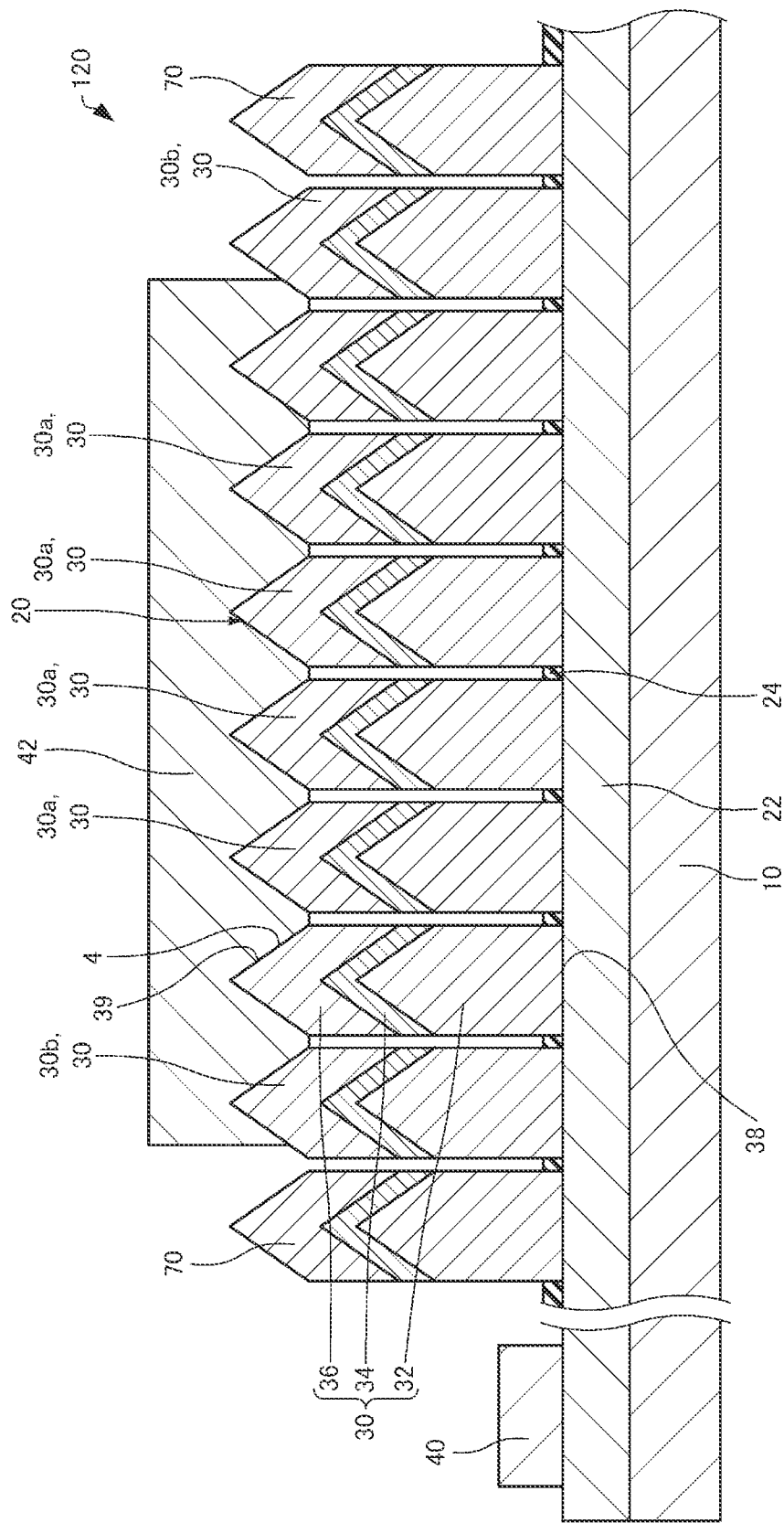
FIG. 9 is a cross-sectional view schematically showing the light emitting device according to the second modified example of the first embodiment.

Then, a light emitting device according to a second modified example of the first embodiment will be described with reference to the drawings. FIG. 7 is a plan view schematically showing the light emitting device 120 according to the second modified example of the first embodiment. FIG. 8 is a cross-sectional view along the line VIII-VIII schematically showing the light emitting device 120 according to the second modified example of the first embodiment. FIG. 9 is a cross-sectional view along the line IX-IX schematically showing the light emitting device 120 according to the second modified example of the first embodiment. It should be noted that in FIG. 7, the illustration of members other than the columnar parts 30, the second electrode 42, the interconnection 60, and the dummy columnar parts 70 is omitted for the sake of convenience. Further, in FIG. 7, illustration is presented seeing through the second electrode 42.

In the light emitting device 100 described above, as shown in FIG. 2 and FIG. 3, when viewed from the stacking direction, the insulating layer 50 is disposed on the periphery of the second electrode 42.

In contrast, in the light emitting device 120, the insulating layer 50 is not disposed as shown in FIG. 7 through FIG. 9. In the light emitting device 120, the interconnection 60 is a bonding wire.

Since the insulating layer 50 is not disposed in the light emitting device 120, it is possible to simplify the manufacturing process.

2. Second Embodiment

2.1. Light Emitting Device

Figure 10:
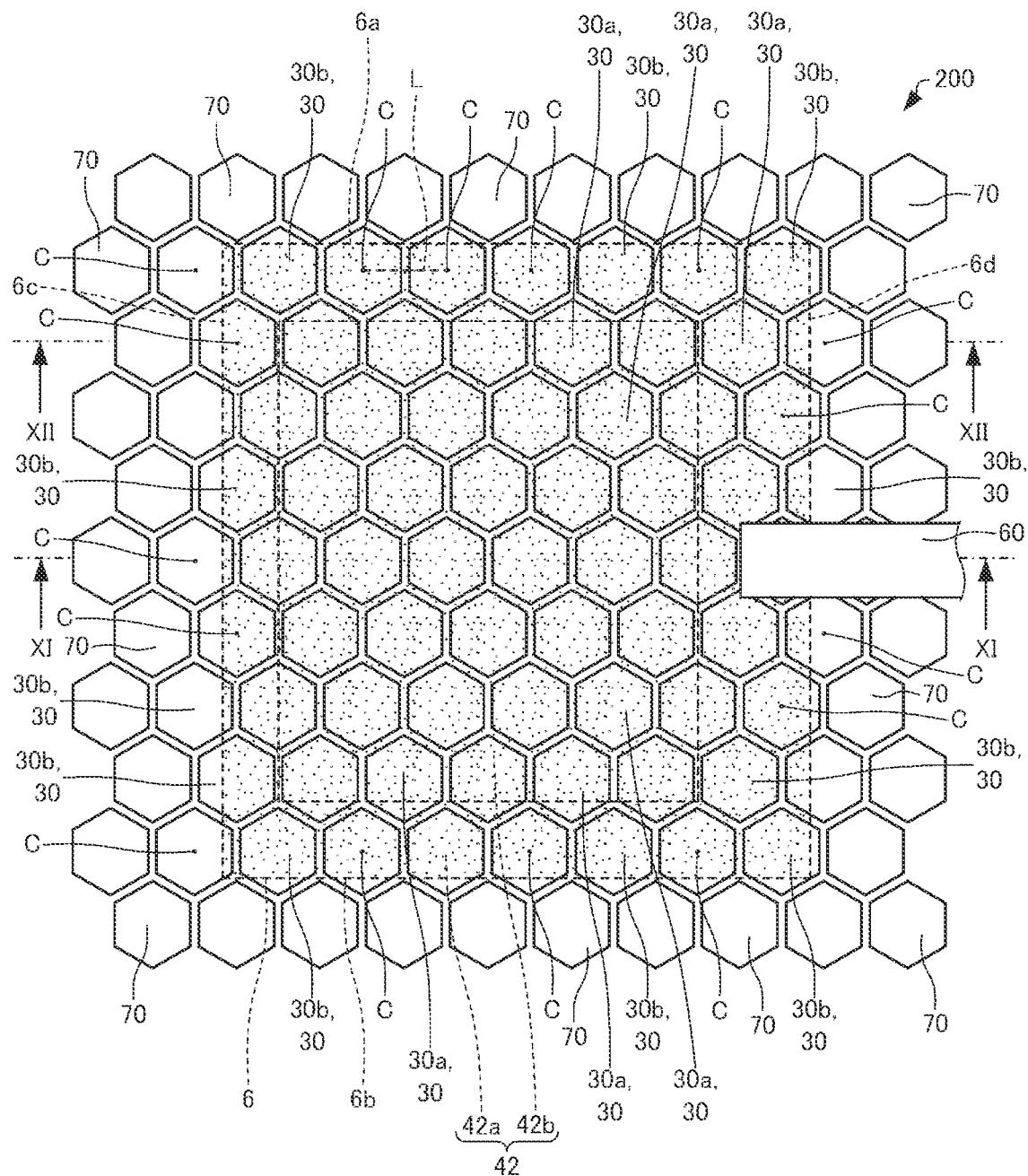
FIG. 10 is a plan view schematically showing a light emitting device according to a second embodiment.
Figure 11:
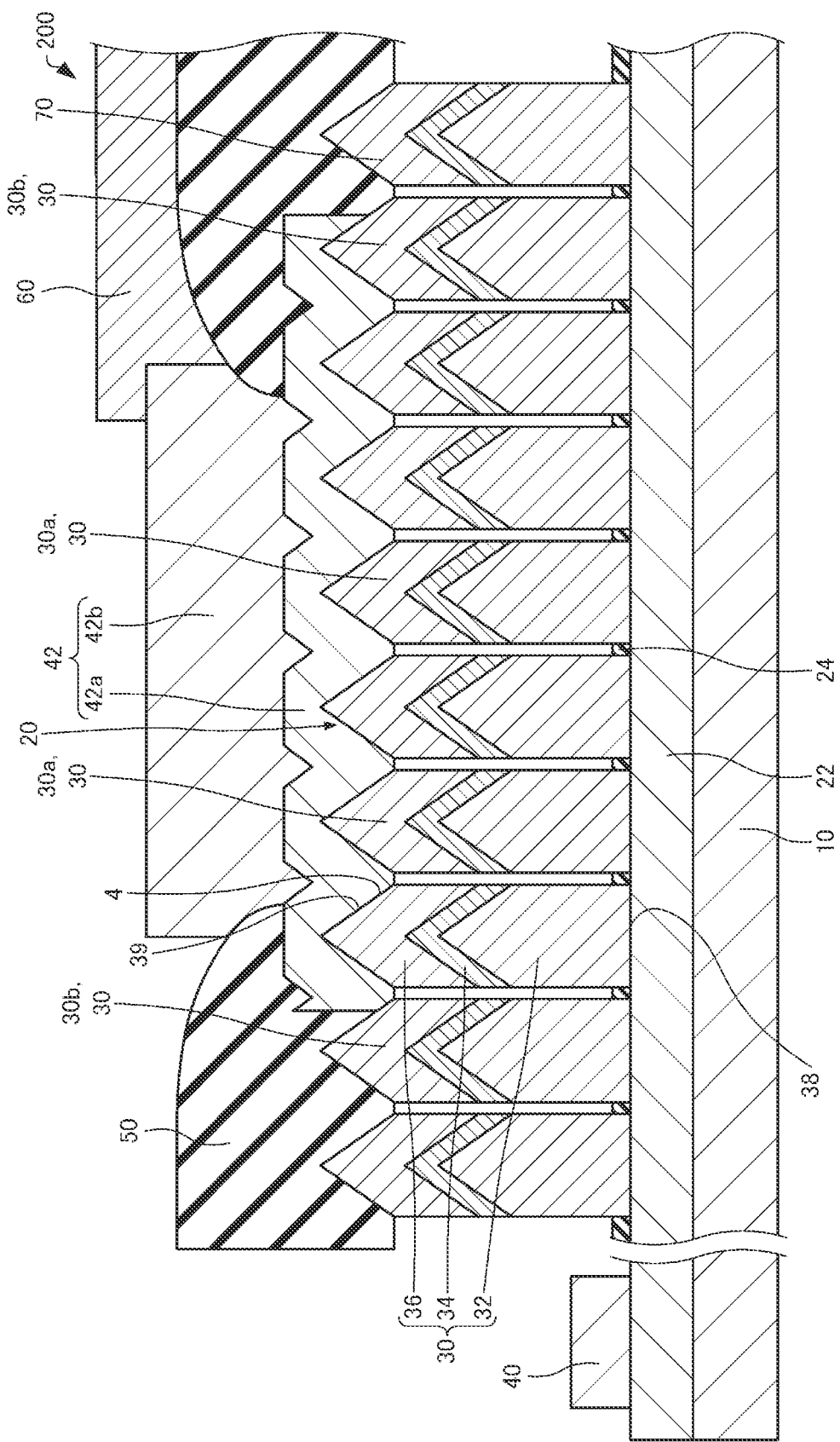
FIG. 11 is a cross-sectional view schematically showing the light emitting device according to the second embodiment.
Figure 12:
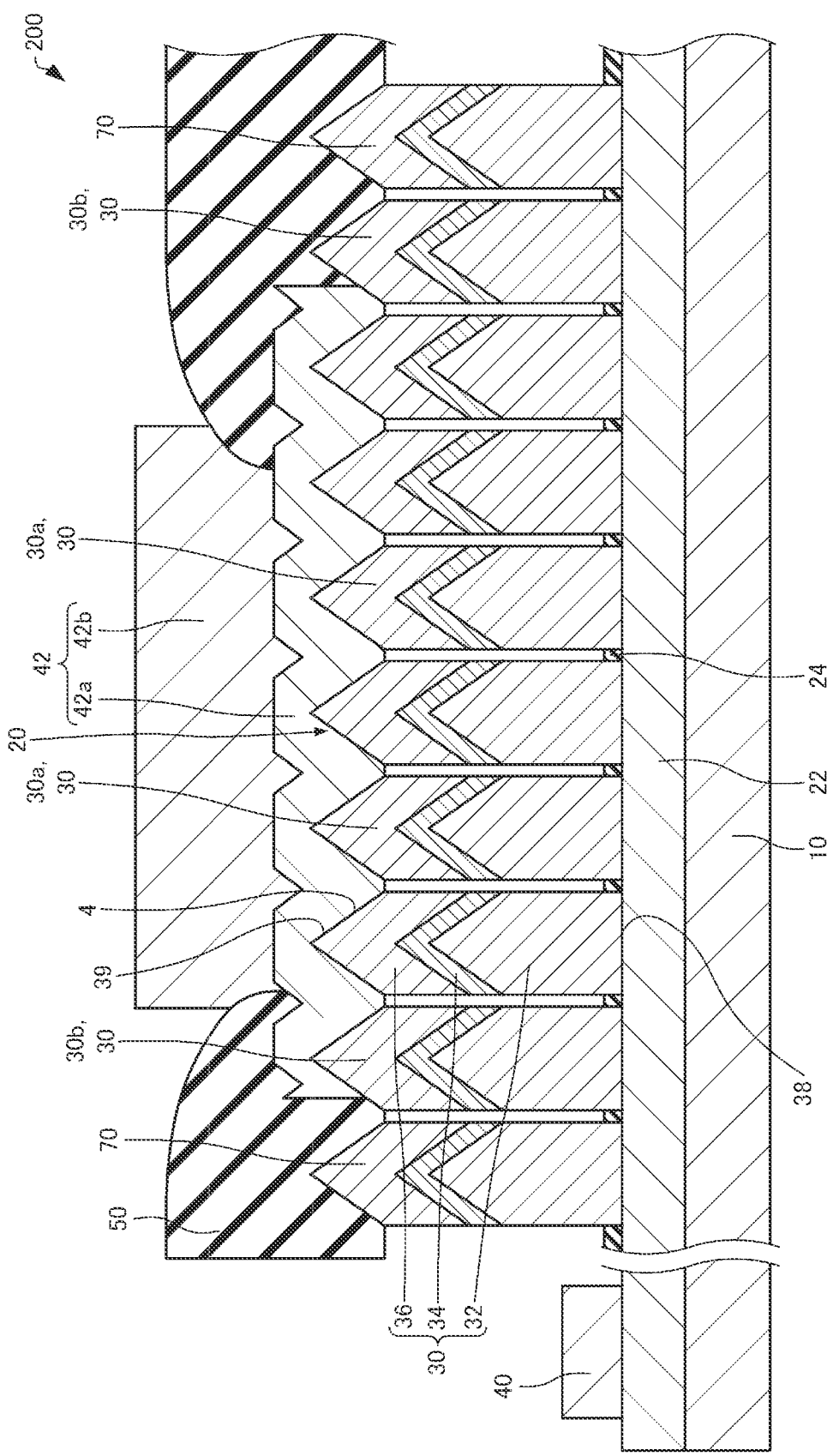
FIG. 12 is a cross-sectional view schematically showing the light emitting device according to the second embodiment.

Then, a light emitting device according to a second embodiment will be described with reference to the drawings. FIG. 10 is a plan view schematically showing the light emitting device 200 according to the second embodiment. FIG. 11 is a cross-sectional view along the line XI-XI shown in FIG. 10, and schematically shows the light emitting device 200 according to the second embodiment. FIG. 12 is a cross-sectional view along the line XII-XII shown in FIG. 10, and schematically shows the light emitting device 200 according to the second embodiment. It should be noted that in FIG. 10, the illustration of members other than the columnar parts 30, the second electrode 42, the interconnection 60, and the dummy columnar parts 70 is omitted for the sake of convenience. Further, in FIG. 10, illustration is presented seeing through the second electrode 42.

Hereinafter, in the light emitting device 200 according to the second embodiment, the members having substantially the same functions as those of the constituent members of the light emitting device 100 according to the first embodiment described above will be denoted by the same reference symbols, and the detailed descriptions thereof will be omitted.

In the light emitting device 200, as shown in FIG. 10 through FIG. 12, the second electrode 42 is different from that of the light emitting device 100 described above in the point that a first portion 42a and a second portion 42b are provided.

As shown in FIG. 11 and FIG. 12, the first portion 42a is disposed on the second semiconductor layer 36. The material of the first portion 42a is, for example, Au or Pt. The resistance of the first portion 42a is lower than, for example, the resistance of the second portion 42b. The second portion 42b is disposed on the first portion 42a. The material of the second portion 42b is, for example, ITO.

In the light emitting device 200, for example, since the second electrode 42 has contact with the second semiconductor layer 36 in the first portion 42a the material of which is Au or Pt, it is possible to reduce the contact resistance between the second semiconductor layer 36 and the second electrode 42 compared to when the second electrode is formed only of ITO.

2.2. Modified Example of Light Emitting Device

Figure 13:
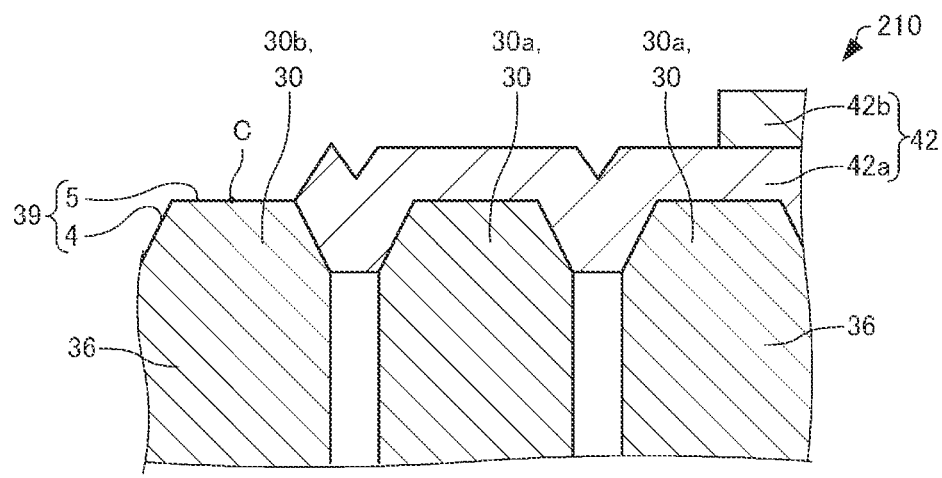
FIG. 13 is a cross-sectional view schematically showing a light emitting device according to a modified example of the second embodiment.
Figure 14:
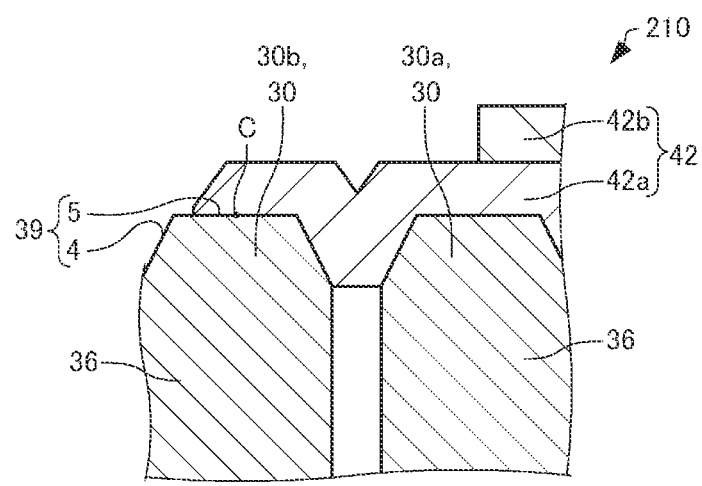
FIG. 14 is a cross-sectional view schematically showing the light emitting device according to the modified example of the second embodiment.

Then, a light emitting device according to a modified example of the second embodiment will be descried with reference to the drawings. FIG. 13 and FIG. 14 are each a cross-sectional view schematically showing the light emitting device 210 according to the modified example of the second embodiment. It should be noted that FIG. 13 corresponds to the cross-sectional view along the line XI-XI shown in FIG. 10, and FIG. 14 corresponds to the cross-sectional view along the line XII-XII shown in FIG. 10.

In the light emitting device 200, the second surface 39 of the columnar part 30 is formed of the facet surface 4 as shown in FIG. 11 and FIG. 12.

In contrast, in the light emitting device 210, the second surface 39 of the columnar part 30 is formed of the facet surface 4 and a c-face 5 as shown in FIG. 13 and FIG. 14. The c-face 5 is a surface parallel to an upper surface of the substrate 10.

When viewed from the stacking direction, the c-surface 5 constitutes the center C of the second columnar part 30b. In the example shown in FIG. 13, the second columnar part 30b the center C of which does not have contact with the second electrode 42 out of the q second columnar parts 30b does not have contact with the second electrode 42 on the c-surface 5, but has contact with the second electrode 42 on the facet surface 4. However, this is not a limitation, it is possible for the second columnar part 30b the center C of which does not have contact with the second electrode 42 out of the q second columnar parts 30b to have contact with the second electrode 42 on the c-surface 5 and the facet surface 4. In the example shown in FIG. 14, the second columnar part 30b the center C of which has contact with the second electrode 42 out of the q second columnar parts 30b has contact with the second electrode 42 on the facet surface 4 and the c-surface 5. It should be noted that in the second columnar part 30b the center C of which has contact with the second electrode 42 out of the q second columnar parts 30b, it is possible for the second electrode 42 to have contact with only a part of the c-surface 5. In the second columnar part 30b the center C of which has contact with the second electrode 42 out of the q second columnar parts 30b, it is possible for the second electrode 42 to have contact with a part of the c-surface 5 and to be separated from the facet surface 4.

When using an InGaN layer as the well layer of the light emitting layer 34, for example, when viewed from the stacking direction, the InGaN layer high in atomic concentration (at %) of In is formed at the center of the light emitting layer 34, and the InGaN layer low in atomic concentration of In is formed in the vicinity of the outer circumference. The InGaN layer low in atomic concentration of In is low in light emission intensity, or fails to emit light in some cases. Therefore, by making the number of the second columnar parts 30b the centers C of which overlap the second electrode 42 larger than the number of the second columnar parts 30b the centers C of which do not overlap the second electrode 42, it is possible to reduce the amount of reduction of the light emission intensity in the vicinity of the outer edge of the second electrode 42. Further, when the light emitting layer 34 has a c-surface area and a facet surface area, in the second columnar part 30b the center C of which does not have contact with the second electrode 42 out of the q second columnar parts 30b, the second electrode overlaps only the facet surface area of the light emitting layer 34, but is not required to overlap the c-surface area of the light emitting layer 34 when viewed from the stacking direction. Further, when the light emitting layer 34 has the c-surface area and the facet surface area, in the second columnar part 30b the center C of which does not have contact with the second electrode 42 out of the q second columnar parts 30b, the second electrode 42 can overlap the facet surface area of the light emitting layer 34, and a part of the c-surface area of the light emitting layer 34 when viewed from the stacking direction.

3. Third Embodiment

Figure 15:
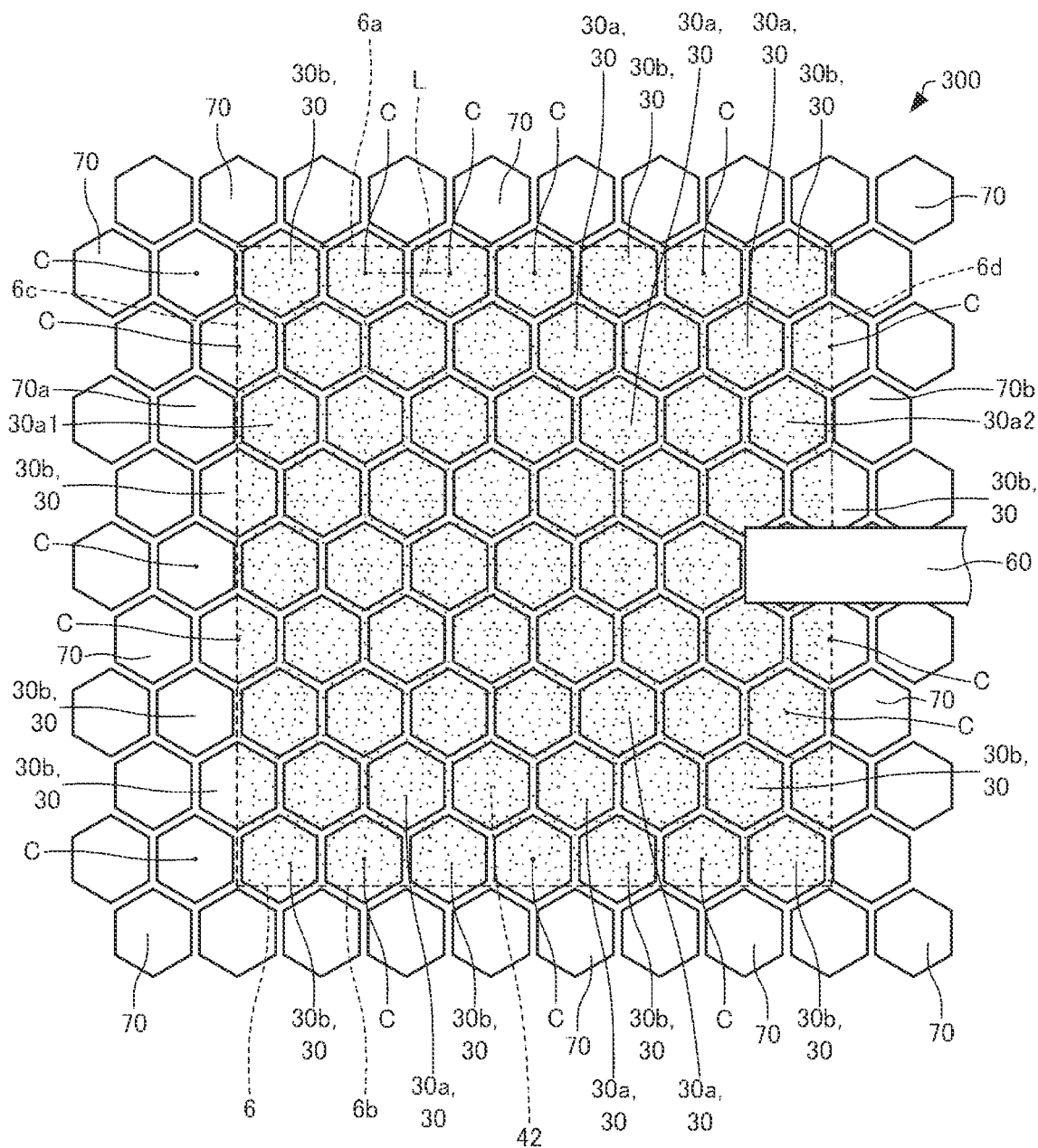
FIG. 15 is a plan view schematically showing a light emitting device according to a third embodiment.

Then, a light emitting device according to a third embodiment will be described with reference to the drawing. FIG. 15 is a plan view schematically showing the light emitting device 300 according to the third embodiment. It should be noted that in FIG. 15, the illustration of members other than the columnar parts 30, the second electrode 42, the interconnection 60, and the dummy columnar parts 70 is omitted for the sake of convenience. Further, in FIG. 15, illustration is presented seeing through the second electrode 42.

Hereinafter, in the light emitting device 300 according to the third embodiment, the members having substantially the same functions as those of the constituent members of the light emitting device 100 according to the first embodiment described above will be denoted by the same reference symbols, and the detailed description thereof will be omitted.

In the light emitting device 100 described above, as shown in FIG. 1, the dummy columnar part 70 adjacent to the first columnar part 30a in the direction of the first side 6a does not exist.

In contrast, in the light emitting device 300, as shown in FIG. 15, the dummy columnar part 70 adjacent to the first columnar part 30a in the direction of the first side 6a exists. For example, the first columnar part 30a1 and the dummy columnar part 70a are adjacent to each other. Further, the first columnar part 30a2 and the dummy columnar part 70b are adjacent to each other.

The third side 6c of the outer edge 6 of the second electrode 42 passes between the first columnar part 30a1 and the dummy columnar part 70a adjacent to each other in the direction of the first side 6a out of the p first columnar parts 30a and the t dummy columnar parts 70. The center C of each of u second columnar parts 30b overlapping the third side 6c out of the q second columnar parts 30b overlaps the second electrode 42. The reference symbol u denotes an integer greater than zero. In the illustrated example, u=4 is assumed. In the light emitting device 300, it is possible to more surely make the u second columnar parts 30b overlapping the third side 6c emit light. The reference symbol u denotes a number of the u second columnar parts The fourth side 6d of the outer edge 6 of the second electrode 42 passes between the first columnar part 30a2 and the dummy columnar part 70b adjacent to each other in the direction of the first side 6a out of the p first columnar parts 30a and the t dummy columnar parts 70. The center C of each of x second columnar parts 30b overlapping the fourth side 6d out of the q second columnar parts 30b overlaps the second electrode 42. The reference symbol x denotes an integer greater than zero. In the illustrated example, x=4 is assumed. In the light emitting device 300, it is possible to more surely make the x second columnar parts 30b overlapping the fourth side 6d emit light.

In the light emitting device 300, the center C of each of the q second columnar parts 30b overlaps the second electrode 42 when viewed from the stacking direction. Therefore, in the light emitting device 300, it is possible to more surely make the q second columnar parts 30b emit light.

4. Fourth Embodiment

Figure 16:
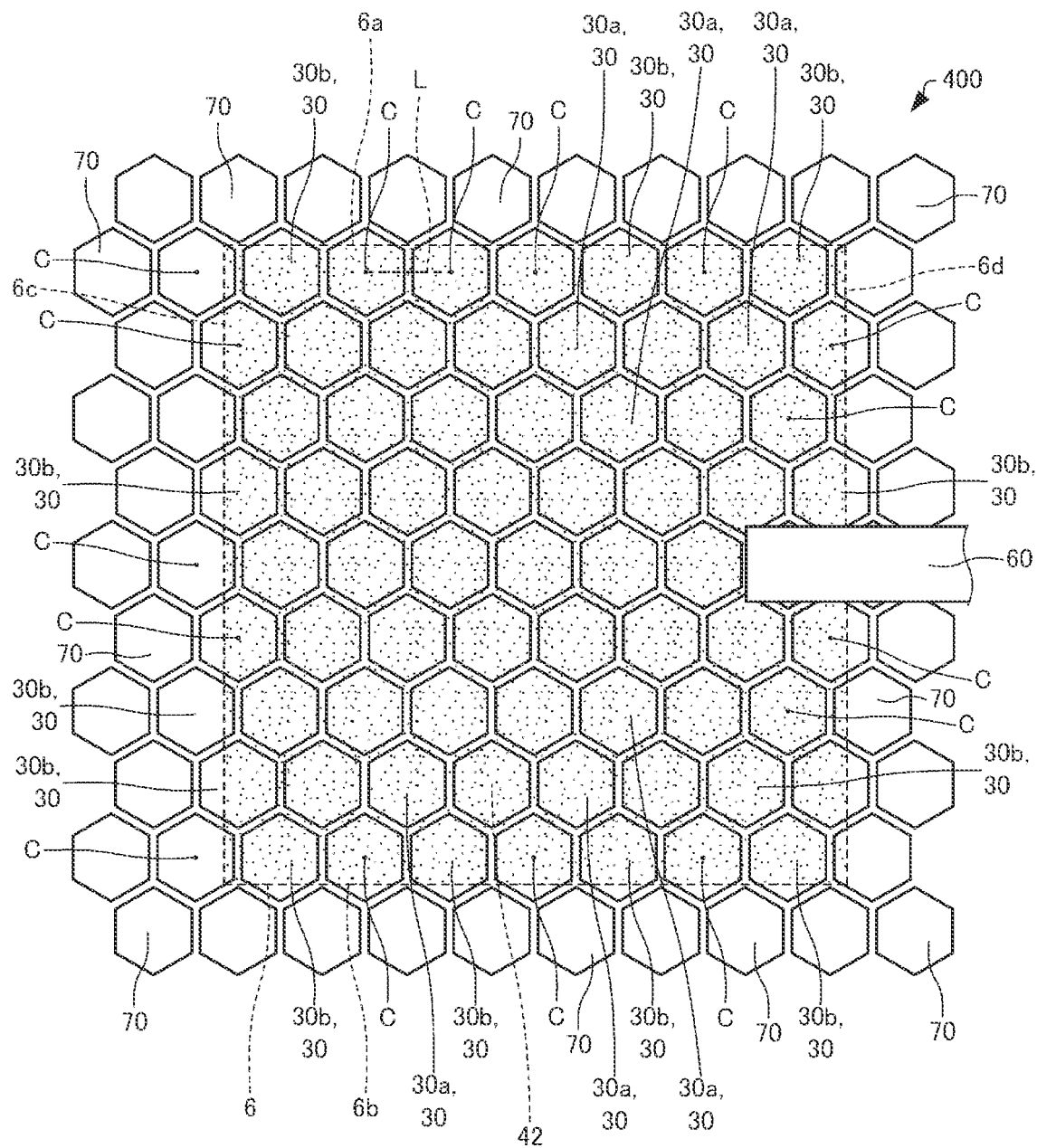
FIG. 16 is a plan view schematically showing a light emitting device according to a fourth embodiment.

Then, a light emitting device according to a fourth embodiment will be described with reference to the drawings. FIG. 16 is a plan view schematically showing the light emitting device 400 according to the fourth embodiment. It should be noted that in FIG. 16, the illustration of members other than the columnar parts 30, the second electrode 42, the interconnection 60, and the dummy columnar parts 70 is omitted for the sake of convenience. Further, in FIG. 16, illustration is presented seeing through the second electrode 42.

Hereinafter, in the light emitting device 400 according to the fourth embodiment, the members having substantially the same functions as those of the constituent members of the light emitting device 100 according to the first embodiment described above will be denoted by the same reference symbols, and the detailed description thereof will be omitted.

In the light emitting device 100 described above, as shown in FIG. 1, the length of the first side 6a is an integer multiple of the pitch of the n columnar parts 30.

In contrast, in the light emitting device 400, as shown in FIG. 16, the length of the first side 6a is not an integer multiple of the pitch of the n columnar parts 30. The center C of each of w second columnar parts 30b overlapping the fourth side 6d overlaps the second electrode 42, and w=4 is assumed.

5. Fifth Embodiment

Figure 17:
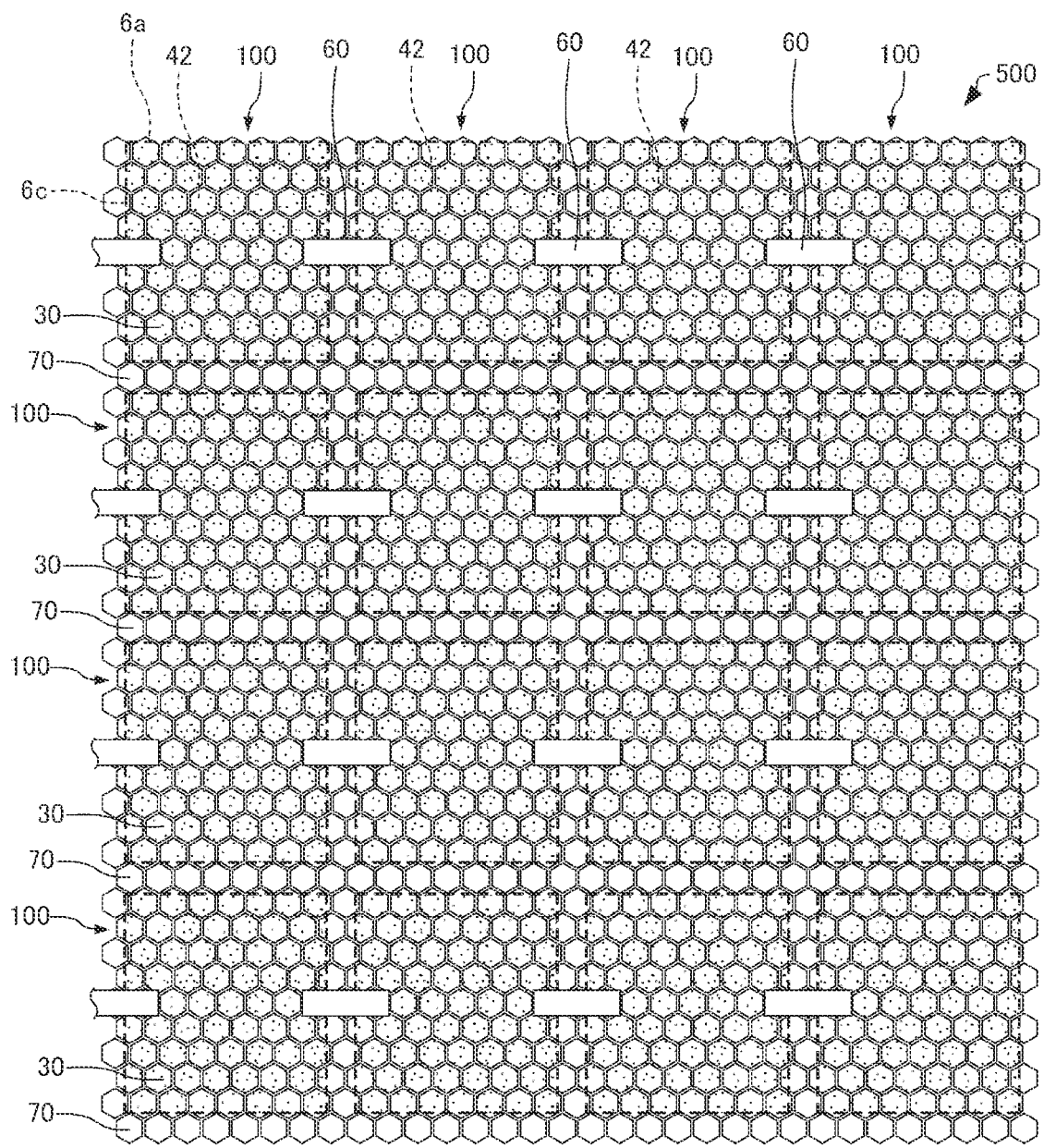
FIG. 17 is a plan view schematically showing a light emitting module according to a fifth embodiment.

Then, a light emitting module according to a fifth embodiment will be described with reference to the drawing. FIG. 17 is a plan view schematically showing the light emitting module 500 according to the fifth embodiment. It should be noted that in FIG. 17, the illustration of members other than the columnar parts 30, the second electrode 42, the interconnection 60, and the dummy columnar parts 70 is omitted for the sake of convenience. Further, in FIG. 17, illustration is presented seeing through the second electrode 42.

As shown in FIG. 17, the light emitting module 500 includes a plurality of light emitting devices 100. The plurality of light emitting devices 100 is arranged in a matrix in the direction of the first side 6a and the direction of the third side 6c. The number of the light emitting devices 100 is not particularly limited, but is 16 in the illustrated example. In the illustrated example, the second electrodes 42 of the plurality of light emitting devices 100 arranged in the direction of the first side 6a are electrically coupled to each other with the interconnections 60.

In the plurality of light emitting devices 100 constituting the light emitting module 500, the substrates 10 are continuous with each other to be disposed integrally. The same applies to the buffer layers 22 and the mask layers 24.

6. Sixth Embodiment

Figure 18:
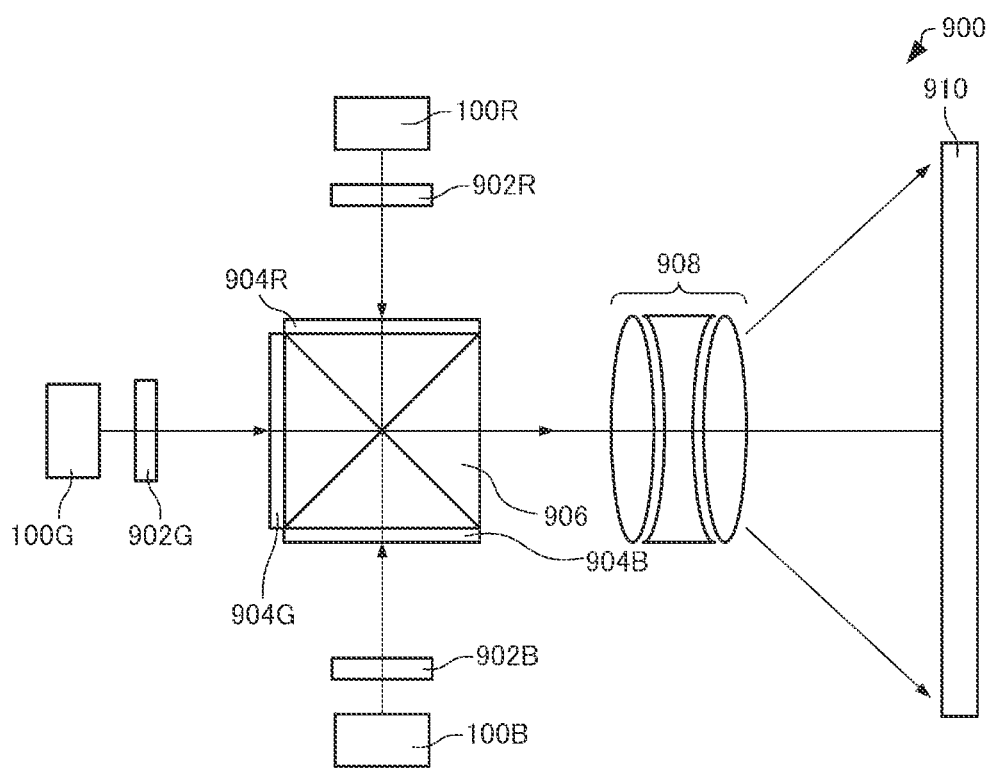
FIG. 18 is a diagram schematically showing a projector according to a sixth embodiment.

Then, a projector according to a sixth embodiment will be described with reference to the drawing. FIG. 18 is a diagram schematically showing the projector 900 according to the sixth embodiment.

The projector 900 has, for example, the light emitting devices 100 as light sources.

The projector 900 includes a housing not shown, a red light source 100R, a green light source 100G, and a blue light source 100B which are disposed inside the housing, and respectively emit red light, green light, and blue light. It should be noted that in FIG. 18, the red light source 100R, the green light source 100G, and the blue light source 100B are simplified for the sake of convenience.

The projector 900 further includes a first optical element 902R, a second optical element 902G, a third optical element 902B, a first light modulation device 904R, a second light modulation device 904G, a third light modulation device 904B, and a projection device 908 all installed inside the housing. The first light modulation device 904R, the second light modulation device 904G, and the third light modulation device 904B are each, for example, a transmissive liquid crystal light valve. The projection device 908 is, for example, a projection lens.

The light emitted from the red light source 100R enters the first optical element 902R. The light emitted from the red light source 100R is collected by the first optical element 902R. It should be noted that the first optical element 902R can be provided with other functions than the light collection. The same applies to the second optical element 902G and the third optical element 902B described later.

The light collected by the first optical element 902R enters the first light modulation device 904R. The first light modulation device 904R modulates the incident light in accordance with image information. Then, the projection device 908 projects an image formed by the first light modulation device 904R on a screen 910 in an enlarged manner.

The light emitted from the green light source 100G enters the second optical element 902G. The light emitted from the green light source 100G is collected by the second optical element 902G.

The light collected by the second optical element 902G enters the second light modulation device 904G. The second light modulation device 904G modulates the incident light in accordance with the image information. Then, the projection device 908 projects an image formed by the second light modulation device 904G on the screen 910 in an enlarged manner.

The light emitted from the blue light source 100B enters the third optical element 902B. The light emitted from the blue light source 100B is collected by the third optical element 902B.

The light collected by the third optical element 902B enters the third light modulation device 904B. The third light modulation device 904B modulates the incident light in accordance with the image information. Then, the projection device 908 projects an image formed by the third light modulation device 904B on the screen 910 in an enlarged manner.

Further, it is possible for the projector 900 to include a cross dichroic prism 906 for combining the light emitted from the first light modulation device 904R, the light emitted from the second light modulation device 904G, and the light emitted from the third light modulation device 904B with each other to guide the light thus combined to the projection device 908.

The three colors of light respectively modulated by the first light modulation device 904R, the second light modulation device 904G, and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 910 by the projection device 908, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 904R, the second light modulation device 904G, and the third light modulation device 904B. Then, it is also possible for the projection device 908 to project the images formed by the red light source 100R, the green light source 100G, and the blue light source 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

The light emitting devices according to the embodiments described above can also be used for other devices than projectors. As the applications other than projectors, there can be cited a light source of, for example, indoor and outdoor illumination, a backlight for a display, a laser printer, a scanner, an in-car light, sensing equipment using light, and communication equipment. Further, the light emitting device according to the embodiments described above can also be applied to a light emitting element of an LED display having microscopic light emitting elements disposed in an array to display an image. Further, the light emitting devices according to the embodiments described above can also be applied to a display device of a head-mounted display or a pair of smart glasses. In other words, the LED display to which the light emitting devices according to the embodiments described above are applied can be used as the display device of the head-mounted display or the pair of smart glasses.

The embodiments and the modified examples described above are illustrative only, and the present disclosure is not limited to the embodiments and the modified examples. For example, it is also possible to arbitrarily combine the embodiments and the modified examples with each other.

The present disclosure includes configurations substantially the same as the configurations described as the embodiments, for example, configurations having the same function, the same way, and the same result, or configurations having the same object and the same advantage. Further, the present disclosure includes configurations obtained by replacing a non-essential part of the configurations described as the embodiments. Further, the present disclosure includes configurations providing the same functions and advantages, and configurations capable of achieving the same object as those of the configurations described as the embodiments. Further, the present disclosure includes configurations obtained by adding a known technology to the configurations described as the embodiments.

The following contents derive from the embodiments and the modified examples described above.

A light emitting device according to an aspect includes n columnar parts, and an electrode configured to inject an electrical current into the n columnar parts, wherein each of the n columnar parts includes a first semiconductor layer, a second semiconductor layer different in conductivity type from the first semiconductor layer, and a light emitting layer disposed between the first semiconductor layer and the second semiconductor layer, when viewed from a stacking direction of the first semiconductor layer and the light emitting layer, p first columnar parts out of the n columnar parts fail to overlap an outer edge of the electrode, q second columnar parts out of the n columnar parts overlap the outer edge of the electrode, a number of the second columnar parts centers of which overlap the electrode out of the q second columnar parts is larger than a number of the second columnar parts centers of which fail to overlap the electrode, and n=p+q is fulfilled.

According to this light emitting device, it is possible to reduce the amount of the reduction of the light emission intensity in the vicinity of the outer edge of the electrode.

In the light emitting device according to the aspect, when viewed from the stacking direction, a center of each of the q second columnar parts may overlap the electrode.

According to this light emitting device, it is possible to more surely make the q second columnar parts emit light.

In the light emitting device according to the aspect, each of the n columnar parts may have a facet surface.

In the light emitting device according to the aspect, when viewed from the stacking direction, the n columnar parts are arranged in a triangular lattice, the outer edge of the electrode has a first side parallel to a first line segment connecting centers of the columnar parts adjacent to each other out of the n columnar parts, and a center of each of r second columnar parts overlapping the first side out of the q second columnar parts may overlap the electrode.

According to this light emitting device, it is possible to more surely make the r second columnar parts emit light.

In the light emitting device according to the aspect, when viewed from the stacking direction, the outer edge of the electrode has a second side parallel to the first side, and a center of each of s second columnar parts overlapping the second side out of the q second columnar parts may overlap the electrode.

According to this light emitting device, it is possible to more surely make the s second columnar parts emit light.

In the light emitting device according to the aspect, there may further be included t third columnar parts which fail to overlap the electrode when viewed from the stacking direction, wherein the t third columnar parts may surround the n columnar parts. The reference symbol t denotes a number of the t third columnar parts According to this light emitting device, due to the t third columnar parts, it is possible to reduce the damage applied to the n columnar parts when manufacturing the light emitting device.

In the light emitting device according to the aspect, when viewed from the stacking direction, the outer edge of the electrode may have a third side perpendicular to the first side, the third side may pass between the first columnar part and the third columnar part adjacent in a direction of the first side to each other out of the p first columnar parts and the t third columnar parts, and a center of each of u second columnar parts overlapping the third side out of the q second columnar parts may overlap the electrode.

According to this light emitting device, it is possible to more surely make the u second columnar parts emit light.

In the light emitting device according to the aspect, when viewed from the stacking direction, an outer edge of each of the n columnar parts may have a hexagonal shape.

A projector according to another aspect includes the light emitting device according to the above aspect.

What is claimed is:

1. A light emitting device comprising:
   n columnar parts; and
   an electrode configured to inject an electrical current into the n columnar parts, wherein
   each of the n columnar parts includes
     a first semiconductor layer,
     a second semiconductor layer different in conductivity type from the first semiconductor layer, and
     a light emitting layer disposed between the first semiconductor layer and the second semiconductor layer,
   when viewed from a stacking direction of the first semiconductor layer and the light emitting layer,
   p first columnar parts out of the n columnar parts fail to overlap an outer edge of the electrode,
   q second columnar parts out of the n columnar parts overlap the outer edge of the electrode,
   a number of the second columnar parts centers of which overlap the electrode out of the q second columnar parts is larger than a number of the second columnar parts centers of which fail to overlap the electrode,
   n denotes a number of the columnar parts,
   p denotes a number of the first columnar parts,
   q denotes a number of the second columnar parts, and
   n=p+q is fulfilled.

2. The light emitting device according to claim 1, wherein when viewed from the stacking direction, a center of each of the q second columnar parts overlaps the electrode.

3. The light emitting device according to claim 1, wherein each of the n columnar parts has a facet surface.

4. The light emitting device according to claim 1, wherein when viewed from the stacking direction,
   the n columnar parts are arranged in a triangular lattice,
   the outer edge of the electrode has a first side parallel to a first line segment connecting centers of the columnar parts adjacent to each other out of the n columnar parts, and
   a center of each of r second columnar parts overlapping the first side out of the q second columnar parts overlaps the electrode, and
   r denotes a number of the r second columnar parts.

5. The light emitting device according to claim 4, wherein when viewed from the stacking direction,
   the outer edge of the electrode has a second side parallel to the first side,
   a center of each of s second columnar parts overlapping the second side out of the q second columnar parts overlaps the electrode, and
   s denotes a number of the s second columnar parts.

6. The light emitting device according to claim 4, further comprising:
   t third columnar parts which fail to overlap the electrode when viewed from the stacking direction, wherein
   the t third columnar parts surround the n columnar parts, and
   t denotes a number of the t third columnar parts.

7. The light emitting device according to claim 6, wherein when viewed from the stacking direction,
   the outer edge of the electrode has a third side perpendicular to the first side,
   the third side passes between the first columnar part and the third columnar part adjacent in a direction of the first side to each other out of the p first columnar parts and the t third columnar parts, and
   a center of each of u second columnar parts overlapping the third side out of the q second columnar parts overlaps the electrode, and
   u denotes a number of the u second columnar parts.

8. The light emitting device according to claim 1, wherein when viewed from the stacking direction,
   an outer edge of each of the n columnar parts has a hexagonal shape.

9. A projector comprising:
   the light emitting device according to claim 1.

* * * * *